US006731527B2

(12) United States Patent
Brown

(10) Patent No.: US 6,731,527 B2
(45) Date of Patent: May 4, 2004

(54) ARCHITECTURE FOR A SEMICONDUCTOR MEMORY DEVICE FOR MINIMIZING INTERFERENCE AND CROSS-COUPLING BETWEEN CONTROL SIGNAL LINES AND POWER LINES

(75) Inventor: David R. Brown, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/903,181

(22) Filed: Jul. 11, 2001

(65) Prior Publication Data

US 2003/0012045 A1 Jan. 16, 2003

(51) Int. Cl.$^7$ ................................................ G11C 5/06
(52) U.S. Cl. ...................... 365/63; 365/51; 365/230.04; 365/230.03; 365/228; 365/233
(58) Field of Search ........................ 365/51, 63, 230.03, 365/230.04, 226, 228, 233

(56) References Cited

U.S. PATENT DOCUMENTS 5,859,807 A * 1/1999 Otori et al. .................. 365/208
5,970,010 A * 10/1999 Hira et al. ................... 365/226
6,240,025 B1 * 5/2001 Park ....................... 365/189.09

* cited by examiner

Primary Examiner—Andrew Q. Tran

(74) Attorney, Agent, or Firm—Browning Bushman P.C.; Hugh R. Kress

(57) ABSTRACT

A semiconductor memory device is organized in such a way that undesirable interference and cross-coupling between various signals generated during operation of the device is minimized. The semiconductor memory device comprises an array of rows and columns of memory cells organized logically and physically into a plurality of sub-arrays. Within each sub-array, the memory cells are organized logically and physically into a plurality of dependent, interleaved banks of memory cells. The banks of memory cells, in turn, each comprise a plurality of memory cores comprising a plurality of memory cells. The memory cores are arranged in such a way as to define a plurality of substantially elongate, orthogonal "stripes" therebetween. Row decoder circuitry for selecting a specified row of memory cells is disposed along the stripes extending in a first direction. Sense amplifier circuitry for detecting the state of selected memory cells is disposed along stripes extending in a second direction, substantially perpendicular to the first direction. Column decode circuitry is disposed along one edge of each memory sub-array such that column select signals propagate along a direction substantially parallel to the stripes of row decoder circuitry. Array control circuitry for generating various control signals activated throughout the course of a memory access (read and/or write) cycle is disposed proximal the column decode circuitry, such that the various control signals propagate along a direction substantially parallel to the column select signals. Elongate power straps for providing operational power to the sub-arrays extend over the sub-arrays in a direction substantially parallel to the column select signals and the control signals.

40 Claims, 20 Drawing Sheets

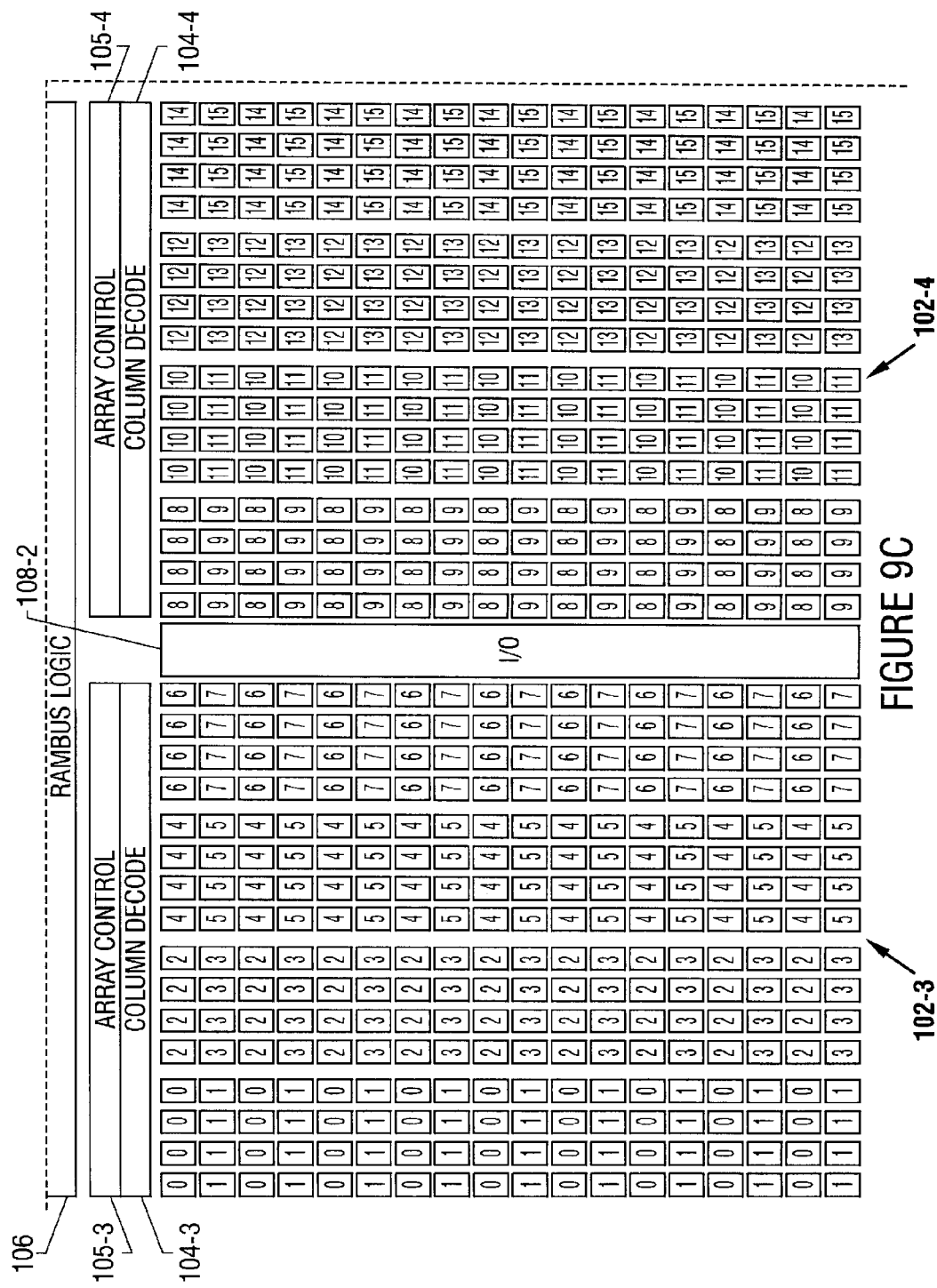

ARCHITECTURE FOR A SEMICONDUCTOR MEMORY DEVICE FOR MINIMIZING INTERFERENCE AND CROSS-COUPLING BETWEEN CONTROL SIGNAL LINES AND POWER LINES

FIELD OF THE INVENTION

The present invention relates generally to semiconductor devices and more particularly to the architectural layout of semiconductor memory devices.

BACKGROUND OF THE INVENTION

Various types of semiconductor memory devices for storing binary information have been known and commercially available for many years. A very popular category of semiconductor memory is dynamic random access memory (DRAM), in which binary data ("1's" and "0's") is represented by the presence or absence of electrical charges on storage capacitors. Typically, a DRAM comprises a plurality of memory cells each consisting of a storage capacitor and at least one access transistor for controlling the reading or writing of the cell, i.e., the application or removal of charge or the detection of the presence or absence of charge on the capacitor. The memory cells are normally arranged in a two-dimensional array of rows and columns of memory cells, with the columns extending in a direction substantially perpendicular to the rows.

In a typical DRAM, accessing one (or more) cells in the array involves the application of a row address and a column address to the device's external address input terminals; such addresses usually take the form of multiple-bit binary numbers represented by electrical logic signals having one of two possible voltage levels. Addressing circuitry associated with the memory array decodes the row and column addresses to generate the access signals appropriate to access the designated cell(s). The access signals are routed to the access transistor(s) for the designated cell(s), and the read or write operation is performed.

During a read operation, an accessed cell's storage transistor is coupled to a sense amplifier which senses and amplifies the presence or absence of a voltage stored on the capacitor. The sense amplifier output, in turn, is applied to a hierarchy of data input/output (I/O) lines, sometimes called a "data path," such that the voltage representative of a binary "1" or a binary "0" is propagated to the memory device's external I/O terminals. (It is assumed for the purposes of the present disclosure that those of ordinary skill in the art are familiar conceptually with the representation of binary "1" and "0" values using electrical signals having one of two logical levels, for example, a zero voltage representing a binary "0" and a voltage of 3.3V representing a binary "1," or vice versa.) During a write operation, the opposite occurs. The value (voltage) to be written to a particular cell is applied to the external I/O terminal and conveyed on the internal data path to the cell identified by an externally applied row and column address pair. When the designated cell is accessed, its access transistor couples the cell's storage capacitor to the data line, such that if a non-zero voltage is present on the data line, that voltage is stored on the capacitor.

Those of ordinary skill in the art will appreciate that the foregoing description in some respects simplifies the underlying mechanisms and procedures involved in the operation of a semiconductor memory. The operation of each sense amplifier in sensing the logic level voltage stored on a given memory cell storage capacitor, for example, is itself a complex process involving the precise generation and timing of a number of internal control signals, as well as the application of carefully regulated power signals. In addition to the necessity of providing conductive lines to communicate these many signals to the appropriate locations upon the silicon substrate, additional areas of the device must be occupied by the control circuitry required to accomplish the read and write operations of a memory device. Functional elements of a memory device, peripheral to and/or interspersed with the memory cells themselves, include sense amplifier circuitry, power supply and regulation circuitry, row and column address decoding circuitry, and the often intricate data path for communicating logic voltages to and from the memory storage cells. The particular arrangement and distribution of all such functional elements is commonly referred to as the architecture of a memory device.

Those of ordinary skill in the art will be familiar with a number of countervailing considerations implicated in the architectural layout and fabrication of semiconductor memory devices. Often foremost among these considerations is the objective of maximizing device density and capacity, i.e., providing the greatest number of individual memory cells in the smallest amount of substrate area. Using currently state-of-the-art design and fabrication techniques, it is possible to provide memory devices capable of storing 256 megabits of data or more on a single substrate. The quest to achieve ever-greater storage capacities and storage densities is ongoing within the semiconductor industry.

Maximizing the operational speed of semiconductor memories is another ongoing design objective. Operational speed refers to the rate at which data can be written into and read out from the memory device. In state-of-the-art memory devices, hundreds or thousands of read and/or write operations can be performed in one second. Like device density, attempts to maximize operating speed are ongoing in the semiconductor industry.

Those of ordinary skill in the art will appreciate that some of the techniques used to achieve one particular design objective can have adverse consequences with respect to other objectives. For example, one obvious approach to maximizing memory capacity and density is to minimize the size of the various semiconductor structures—transistors, capacitors and the like—making up the memory. However, decreasing structure sizes can have an adverse impact upon the memory's speed; reducing the size of memory cell storage capacitors means that less charge can be stored on each capacitor, and with less charge to sense, the sense amplifiers' response times are likely to be increased.

Likewise, while it may be desirable from the standpoint of device density to form semiconductor structures in a physically dense and close relationship on the substrate, such a design philosophy can lead to such problems as interference and/or cross-coupling of electrical signals in the memory, thereby having an adverse impact on other operational characteristics, such as reliability or speed. It is the challenge facing semiconductor device designers to reconcile such countervailing considerations and reach acceptable compromises with respect to the various design objectives and performance criteria. Of course, overriding all such considerations are numerous practical limitations, such as limitations on the physical size of semiconductor structures that can be formed on a silicon substrate using existing fabrication technology.

In order to arrive at a design which achieves an acceptable a balance between the many countervailing considerations associated with semiconductor memory architectures, memory designers must take into account the overall architectural layout of the device in order to recognize the potential adverse consequences of measures taken to improve one device characteristic upon all other relevant characteristics.

SUMMARY OF THE INVENTION

In view of the foregoing and other considerations, the present invention relates to an improved architecture for a semiconductor memory device. In accordance with one embodiment of the invention, a semiconductor memory device is organized in such a way that undesirable interference and cross-coupling between various signals generated during operation of the device is minimized. By minimizing such undesirable effects in particular ways, other device characteristics, such as the size of various circuit elements, can advantageously also be optimized.

In one embodiment of the invention, a semiconductor memory device comprising an array of rows and columns of memory cells is organized logically and physically into a plurality of sub-arrays. Within each sub-array, the memory cells are organized logically and physically into a plurality of dependent, interleaved banks of memory cells. The banks of memory cells, in turn, each comprise a plurality of memory cores comprising a plurality of memory cells. The memory cores are arranged in such a way as to define a plurality of substantially elongate, orthogonal "stripes" therebetween. Row decoder circuitry for selecting a specified row of memory cells is disposed along the stripes extending in a first direction. Sense amplifier circuitry for detecting the state of selected memory cells is disposed along stripes extending in a second direction, substantially perpendicular to the first direction.

In accordance with one aspect of the invention, column decode circuitry is disposed along one edge of each memory sub-array such that column select signals propagate along a direction substantially parallel to the stripes of row decoder circuitry. In accordance with another aspect of the invention, array control circuitry for generating various control signals activated throughout the course of a memory access (read and/or write) cycle is disposed proximal the column decode circuitry, such that the various control signals propagate along a direction substantially parallel to the column select signals.

By ensuring that the control signals, power signals, and column select signals all propagate substantially in parallel, cross-talk and interference among the various internal signals is minimized.

In accordance with another aspect of the invention, sense amplifier output signals are routed to input/output (I/O) circuitry disposed alongside each sub-array. Due to the interleaved banking arrangement of the memory array, the number of banks that the I/O path crosses as the sensed data is propagated to the I/O circuitry is minimized. The interleaved banking arrangement further minimizes the number of banks which share any given power strap.

BRIEF DESCRIPTION OF THE DRAWINGS

The foregoing and other features and aspects of the subject invention will be best understood with reference to a detailed description of a specific embodiment of the invention, which follows, when read in conjunction with the accompanying drawings, in which:

FIGS. 9A, 9B, 9C, and 9D are respective top left, top right, bottom left, and bottom right portions of a block diagram of the memory device from FIG. 8 showing the interleaved bank organization thereof.

DETAILED DESCRIPTION OF A SPECIFIC EMBODIMENT OF THE INVENTION

In the disclosure that follows, in the interest of clarity, not all features of actual implementations are described. It will of course be appreciated that in the development of any such actual implementation, as in any such project, numerous engineering and programming decisions must be made to achieve the developers' specific goals and subgoals (e.g., compliance with system and technical constraints), which will vary from one implementation to another. Moreover, attention will necessarily be paid to proper engineering practices for the environment in question. It will be appreciated that such a development effort might be complex and time-consuming, but would nevertheless be a routine undertaking for those of ordinary skill in the relevant fields.

Figure 1:
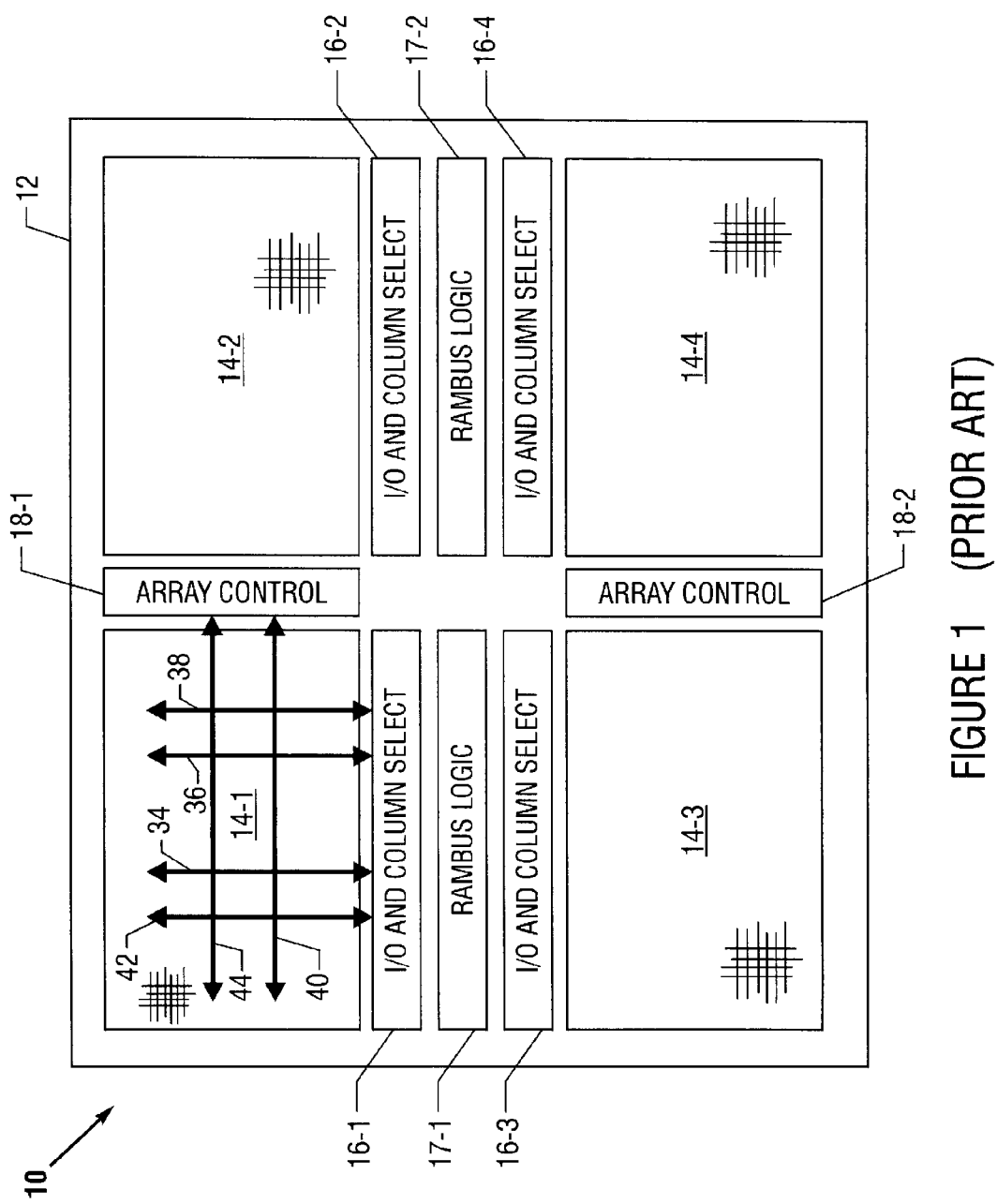
FIG. 1 is a block diagram of a prior art semiconductor memory device comprising an array of rows and columns of memory cells subdivided into a plurality of sub-arrays.

Referring to FIG. 1, there is shown a schematic/block diagram showing the architectural layout of a prior art semiconductor memory device 10. Like most conventional semiconductor memories, memory 10 comprises a crystalline semiconductor substrate 12 upon which the various semiconductor structures (transistors, capacitors, conductive traces and the like) are formed.

Device 10 in FIG. 1 is a so-called Rambus DRAM (RDRAM). Those of ordinary skill in the art will appreciate that to qualify as an RDRAM, a memory device must conform to a predetermined proprietary standard relating to the interface between the memory and a memory controller, this standard being defined by Rambus, Inc., Mountain View, Calif. A notable characteristic of Rambus-compliant memory devices is that large amounts of data can be fetched from a memory device in a single access cycle. A Rambus access cycle is initiated through application of a timed succession of control words providing information to the memory about the memory locations to be accessed, and the manner in which they are to be accessed. Although the present disclosure is made in the context of RDRAM devices and architectures, this is not believed to be a critical aspect of the present disclosure. The issues that the present invention seeks to address are not ones unique to RDRAMs, and it is believed that the principles of the present invention may be advantageously applied to other types of memory devices, including without limitation, more conventional DRAMs, SDRAMs and the like.

In accordance with a common architectural approach, the memory cells of memory device 10 are arranged in a plurality of essentially identical sub-arrays 14-1, 14-2, 14-3, and 14-4. Those of ordinary skill in the art will appreciate that such an architecture advantageously endows device 10 with a symmetry that is beneficial from the standpoint of minimizing and equalizing the lengths of various conductive paths, among other things. In the presently disclosed embodiment, device 10 has a 144 megabit capacity, such that each sub-array 14-1, 14-2, 14-3, and 14-4 stores 36 megabits. Once again, however, those of ordinary skill in the art will appreciate that the present invention may be practiced in conjunction with memories of essentially any capacity.

With continued reference to FIG. 1, between the two left-hand sub-arrays 14-1 and 14-3 are areas occupied by input/output (I/O) and column select circuits 16-1 and 16-3; similarly, between the two right-hand sub-arrays 14-2 and 14-3 are areas occupied by I/O and column select circuits 16-2 and 16-4. I/O and column select circuits 16-1, 16-2, 16-3 and 16-4 each operate to decode column address signals to derive column select signals applied to the respective associated sub-arrays, and further to perform I/O functions involving receiving data signals read from selected memory cells from column lines extending through each sub-array. With such an arrangement, column select signals are routed outward (i.e., up and down in FIG. 1) from column select circuits 16-1, 16-2, 16-3, and 16-4 into sub-arrays 14-1, 14-2, 143, and 14-4 respectively during a memory access. Data input and output signal paths are oriented in substantially the same direction as the column select signals.

Also disposed between the upper and lower halves of memory 10 are Rambus logic circuits 17-1 and 17-2. Rambus logic circuits 17-1 and 17-2 are responsible for controlling device 10 to operate in conformance with the Rambus standard, performing such functions as decoding packets of Rambus command words applied to device 10 to initiate memory cycles, and generally coordinating operation of the device in accordance with the Rambus standard. Control signals from Rambus logic circuits 17-1 and 17-2 are applied to the respective sub-arrays along control signal lines that are substantially parallel to the column select and I/O signal lines. Details of the particular implementation and operation of Rambus logic circuits 17-1 and 17-2 are not believed to be relevant for the purposes of the present disclosure.

Between the two top sub-arrays 14-1 and 14-2, and similarly between the two bottom two sub-arrays 14-3 and 14-4, are areas occupied by array control circuits 18-1 and 18-2, respectively. Array control circuits 18-1 and 18-2 perform such functions as generating sense amplifier timing signals, predecoding row addresses, bank selection, and generating other control and timing signals involved in read and write accesses to the memory sub-arrays. Accordingly, the various control signals generated by array control circuits 18-1 and 18-2 are routed outward (i.e., right and left in FIG. 1) across sub-arrays 14-1, 14-2, 14-3, and 144.

It is believed that the functions of I/O and column circuits 16-1 and 16-2, as well as those of array control circuits 18-1 and 18-2 and Rambus circuits 17-1 and 17-2 will be familiar to those of ordinary skill in the art, and will not be elaborately described herein. Moreover, it is believed that the specific manner of implementation of such circuits is not of particular concern for the purposes of the present invention and would be a matter of routine engineering to those of ordinary skill in the art.

Figure 2:
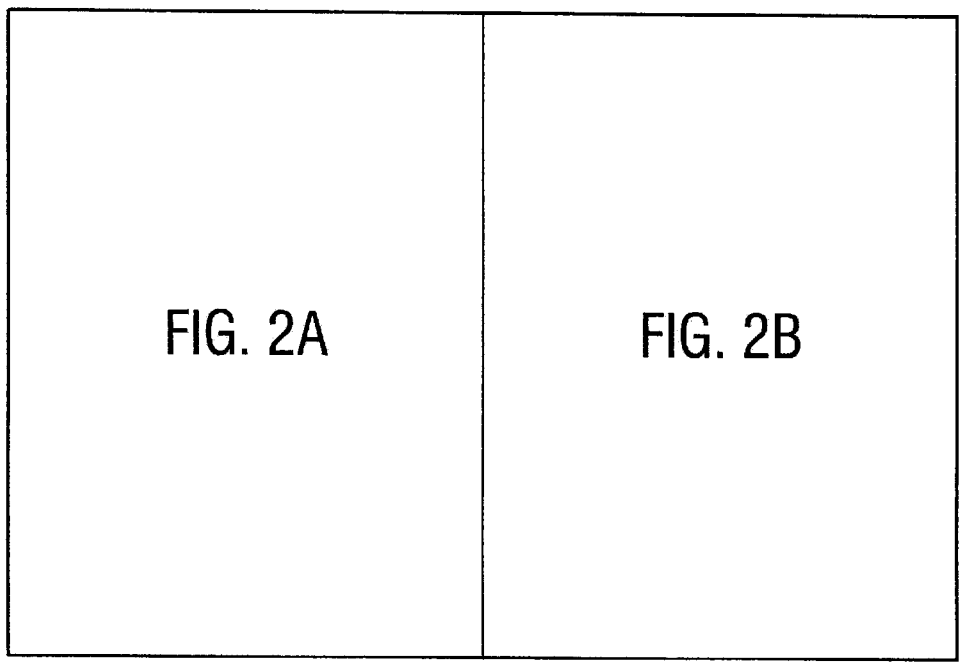
FIG. 2 shows the proper relationship between FIGS. 2A and 2B.
Figure 2A:
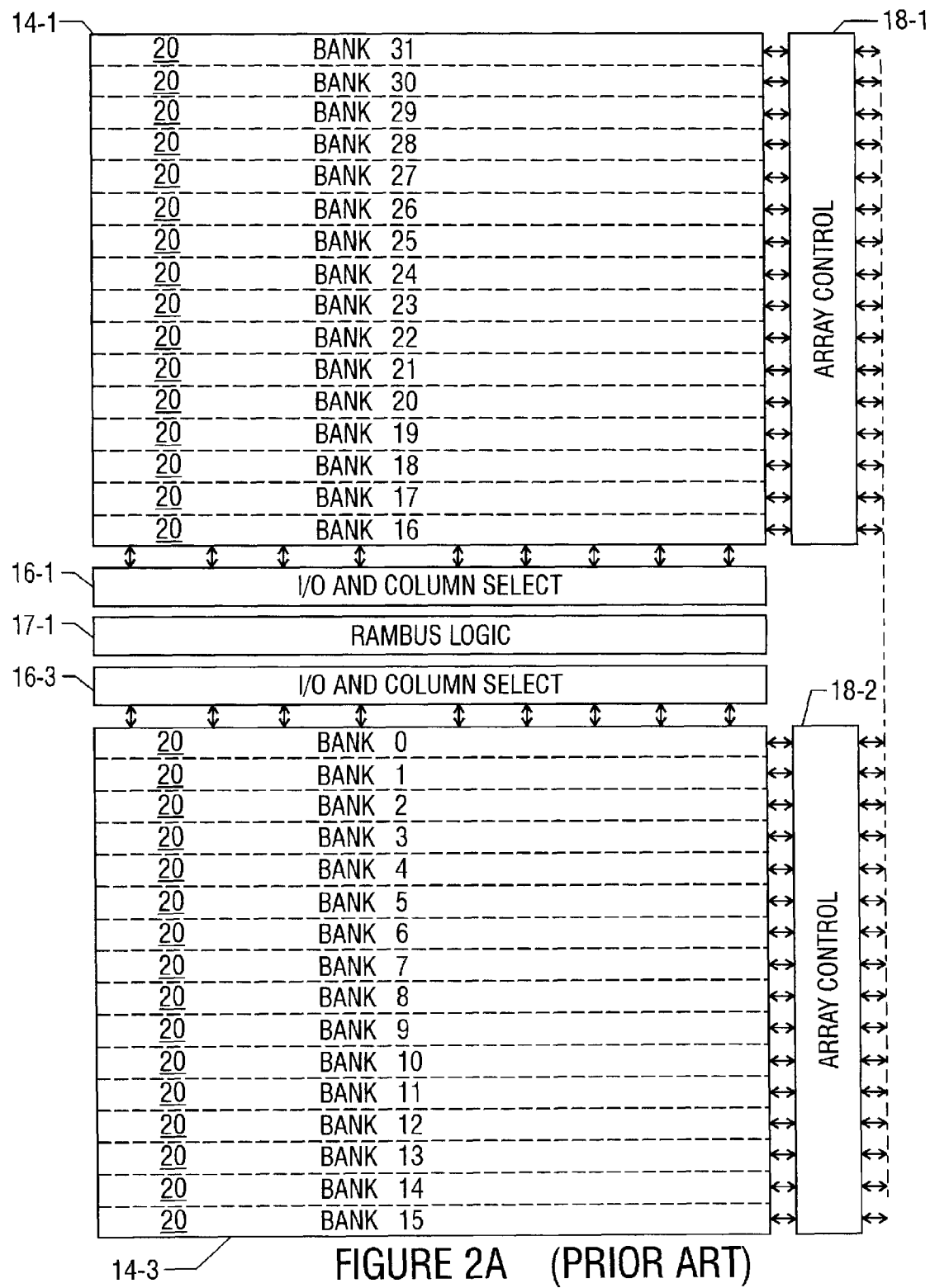
FIGS. 2A and 2B are respective right—and left—hand portions of a block diagram of the memory device of FIG. 1 showing the banked organization thereof.
Figure 2B:
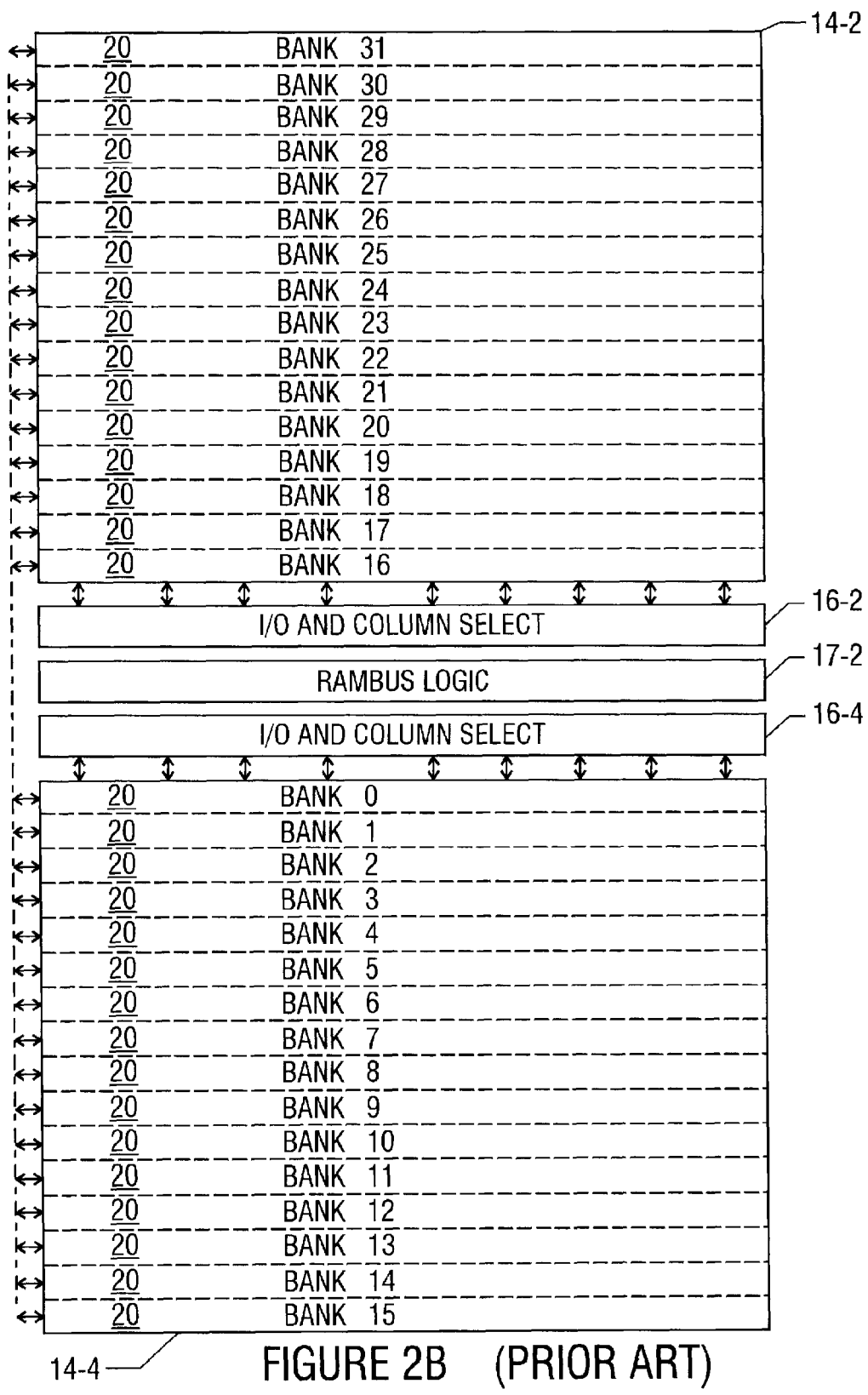

Turning to FIGS. 2a and 2b, which are to be viewed side-by-side as shown in FIG. 2 and which will collectively be referred to herein as "FIG. 2," there is shown a somewhat more detailed schematic/block diagram of device 10 from FIG. 1, including sub-arrays 14-1 and 14-3, I/O and column select circuit 16-1, Rambus circuits 17-1 and 17-2, and array control circuits 18-1 and 18-2.

In accordance with another known logical/architectural practice in the field of semiconductor memory design, it can be seen in FIG. 2 that each sub-array 14-1, 14-2, 14-3 and 14-4, is subdivided logically and/or physically into a plurality of memory banks 20. In the embodiment of FIG. 2, each sub-array 14-1, 14-2, 14-3, and 14-4 comprises sixteen horizontal banks 20 each storing slightly over two megabits. The technique of memory banking is generally regarded as advantageous as the size and density of memory devices increase. Moreover, those of ordinary skill in the art will appreciate that banking techniques can beneficially enhance the efficiency and speed with which the memory can be accessed, since the control signals for a memory access in one bank can be in the process of being set up before a previous access to another bank is even completed. That is, the so-called "set-up time" for one access can begin even before a previous access is completed. For example, in the embodiment of FIG. 2, an access to any of banks 0–15 can begin to be set up even while an access to any of banks 16–31 is still completing. Without banking, this is typically not the case, since the control signals being set up for a second access would likely interfere with an incomplete first access.

Figure 3:
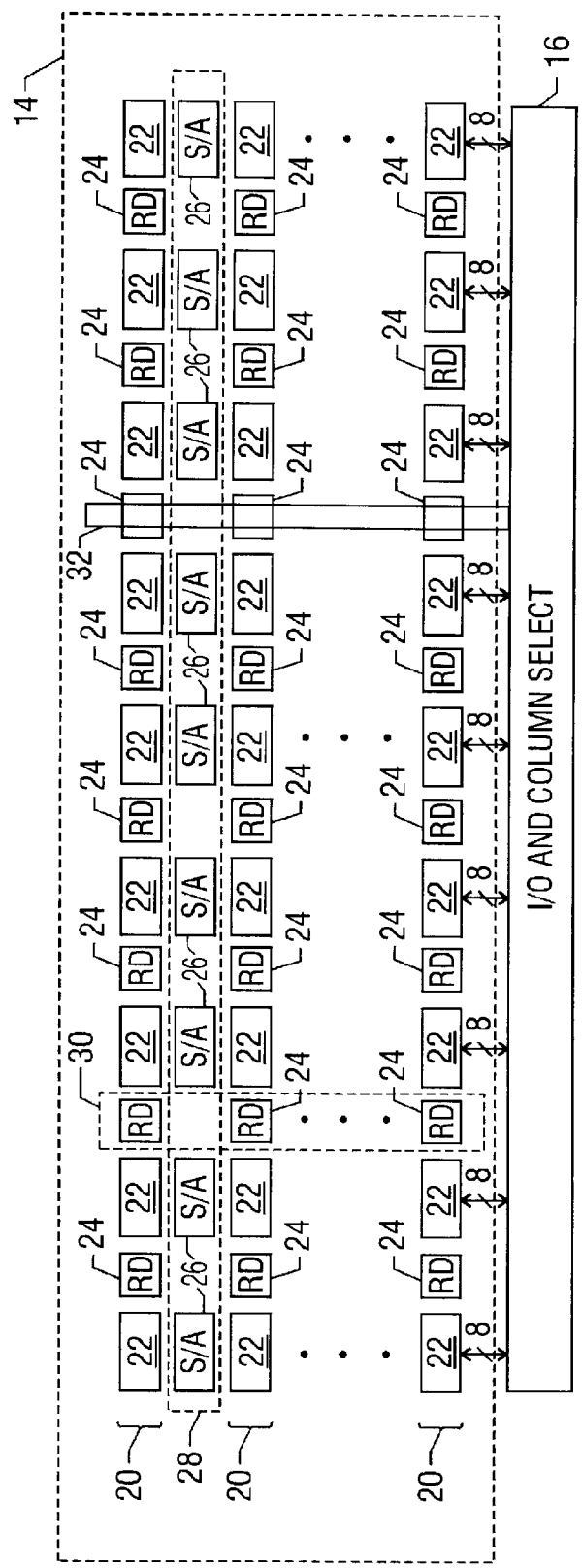
FIG. 3 is a block diagram of one of the sub-arrays in the memory device of FIG. 1.

Turning now to FIG. 3, there is shown a slightly more detailed schematic/block diagram of one of the four sub-arrays 14-1, 14-2, 14-3, and 14-4 in memory 10. As noted above, the sub arrays 14-1, 14-2, 14-3 and 14-4 are substantially identical to one another; hence, in FIG. 3, the sub-array is designated with reference numeral 14 to reflect the fact that it is representative of any of the four sub-arrays in the device. This referencing convention is adopted in this disclosure for other substantially identical, repeated components of device 10; for example, reference numeral 16 is used in FIG. 3 to designate the I/O and column select circuit, reflecting the fact that what is shown in FIG. 3 is representative of either circuit 16-1 or 16-2 from FIG. 1.

As can be observed in FIG. 3, each memory bank 20 comprises a plurality of memory cores 22 disposed in an elongate "stripe," with each adjacent pair of cores 22 having an associated row decoder (RD) circuit 24 disposed therebetween. In this embodiment, each memory core 22 comprises a 256 Kb sub-array of memory cells.

Disposed in an elongate "stripe" area between each adjacent pair of memory banks 20 is a row of associated sense amplifiers 26 shared by the adjacent memory cores 22, and each of the sense amplifiers 26 is disposed within one such elongate stripe area. One typical sense amplifier stripe is designated by dashed line 28 in FIG. 3, it being understood that such a sense amplifier stripe is present between every two adjacent pairs of banks 20. Each sense amplifier stripe 28 extends in a direction substantially parallel to the elongate memory banks 20. Similarly, row decoders 24 are disposed within elongate "stripe" areas, a typical one being designated by dashed line 30 in FIG. 3. Each row decoder stripe 30 extends in a direction substantially perpendicular to the elongate memory banks 20, such that each row decoder stripe 30 intersects each bank 20 of sub-array 14.

In memory device 10, power straps for providing necessary operating power to memory banks 20 extend generally in the region of stripes 30, i.e., perpendicular to the elongate direction of banks 20. An exemplary power strap 32 is shown in FIG. 3, it being understood that a power strap 32 is disposed above each row decoder stripe 30, although only one is shown for clarity. Those of ordinary skill in the art will appreciate that such power straps 32 are typically formed as one of a semiconductor device's metal layers, and are formed above row decoders 24, with insulating layers of, for example, silicon oxide, separating the power straps from the structures comprising the row decoders 24 and associated circuitry disposed in row decoder stripes 30. In accordance with customary practice, power straps 32 descend into through-holes or vias in the insulating layer at periodic locations along their lengths in order to make electrical contact with the operational structures beneath that are associated with row decoders 24.

Those of ordinary skill in the art will recognize some potential disadvantages to the architectural arrangement of components in the memory 10 of FIGS. 1–3. One potential problem relates to the placement of column decoders. Because each column select line crosses over all banks 20 in a sub-array 14, at least some of the signals and noise generated by activating a column select line and associated circuitry for one bank can potentially interfere with operation of all other banks 20 in the sub-array 14.

Likewise, the power straps 32 extending perpendicularly across each of the banks 20 can cause interference. Moreover, those of ordinary skill in the art will appreciate that since the power straps 32 make contact with structures in each bank 20 as they extend along row decoder stripes 30, it is possible that accesses to multiple banks 20 can be occurring simultaneously causing power straps 32 to carry current from multiple banks 20 all at once. As a result of this additional power consumption and associated electrical noise generation, it may be necessary to make the power straps 32 larger than would otherwise be necessary or desirable.

A further potential disadvantage of the architecture described herein with reference to FIGS. 1–3 relates to the routing of control signals generated in association with each memory access cycle. In the device of FIGS. 1–3, some control signals are generated by array control circuits 18-1 and 18-2, while others originate from I/O and column select units 16-1 and 16-2. As a result, some control signals must traverse multiple banks 20, potentially leading to undesirable coupling and interference effects, while others extend substantially parallel to banks 20 in stripes 28 defined therebetween, potentially interfering with operation of sense amplifiers 26. In addition, control signal timing is complicated due to the fact that control signal path lengths will differ depending upon whether their routing is perpendicular to banks 20 or parallel to banks 20.

Summarizing, with reference again to FIG. 1, an arrow 34 indicates the general orientation of power straps 32, an arrow 36 indicates the orientation of column select signal routing, an arrow 38 indicates the orientation of some of control signal routing, an arrow 40 indicates the orientation of other control signal routing, an arrow 42 indicates the orientation data I/O signals in the array 14, and an arrow 44 indicates the orientation of elongate memory banks 20. As can be observed from FIG. 1, power signals, column select signals, I/O signals, and some control signals are routed substantially perpendicularly across memory banks 20, whereas other control signals, such as sense amplifier control signals, bank selection signals, and the like, are routed substantially parallel to memory banks 20. Those of ordinary skill in the art will recognize that such an architecture can lead to difficulties with signal cross-coupling, degradation, and signal propagation and timing issues. Conventional measures to address such difficulties typically result in diminished device performance, extra processing steps in fabrication, and/or larger die sizes.

Figure 4:
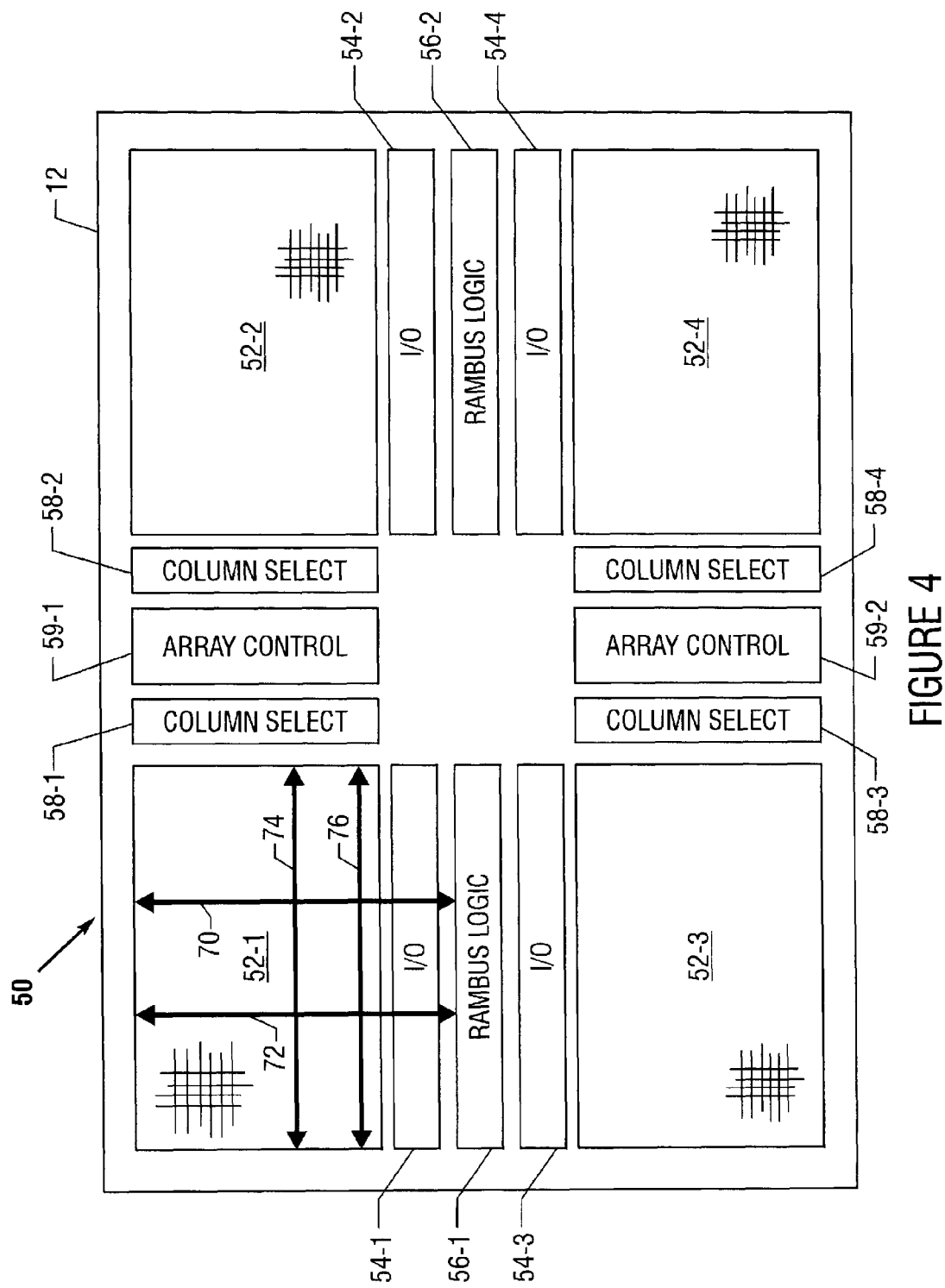
FIG. 4 is a block diagram of an alternative embodiment of a semiconductor memory device comprising an array of rows and columns of memory cells subdivided in to a plurality of sub-arrays.

Turning now to FIG. 4, there is depicted in schematic/block form a memory device 50 having an architecture which potentially eliminates some of the aforementioned potential problems with the architecture of device 10 from FIGS. 1–3.

Device 50, like device 10, comprises four substantially identical sub-arrays 52-1, 52-2, 52-3, and 52-4 of memory cells. I/O circuits 54-1, 54-2, 54-3, and 54-4 are disposed between the upper and lower halves of memory device 50 and provide the datapath into and out of each respective sub-array. Also disposed between the upper and lower halves of the memory 50 are Rambus circuits 56-1 and 56-2. As in device 10, Rambus circuits 56-1 and 56-2 provide the logic and control necessary for device 50 to comply with the Rambus standard for memory accesses.

Associated with respective sub-arrays 52-1, 52-2, 52-3, and 52-4 are column select circuits 58-1, 58-2, 58-3, and 58-4 for generating column select signals corresponding to addressed locations. Disposed between column select circuits 58-1 and 58-2, and similarly between column select circuits 58-3 and 58-4 are array control circuits 59-1 and 59-2 for generating various array control signals as discussed above. With this arrangement, both the column select signals and array control signals are routed outward (i.e., left and right in FIG. 4) across sub-arrays 52-1, 52-2, 52-3, and 52-4.

Figure 5:
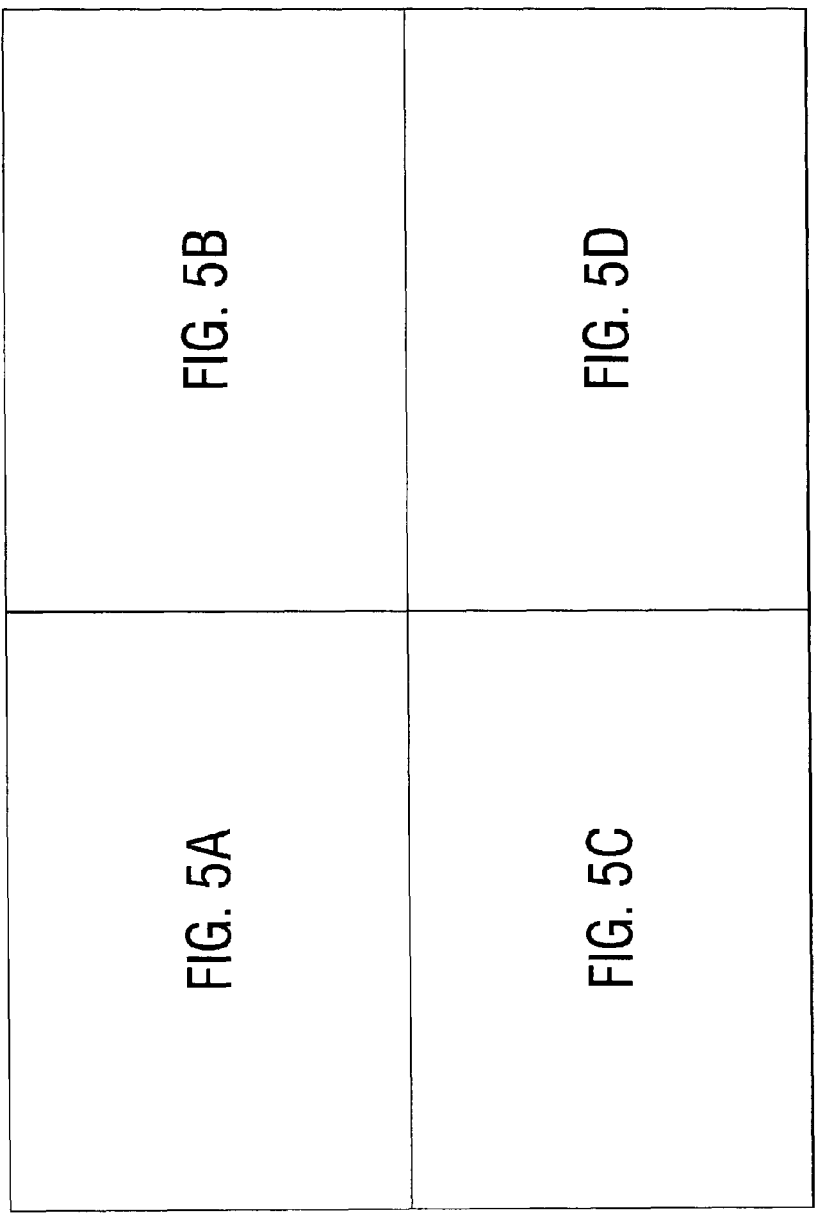
FIG. 5 shows the proper relationship between FIGS. 5A, 5B, 5C, and 5D.

FIGS. 5A, 5B, 5C, and 5D, when assembled as shown in FIG. 5 (collectively, "FIG. 5") provide a more detailed block diagram of memory device 50. From FIG. 5, it can be observed that each sub-array 52-1, 52-2, 52-3, and 52-4 is organized into a plurality of logical banks; however, the banking arrangement in the memory 50 of FIG. 5 differs from that in the memory 10 in FIG. 1. In particular, memory 50 utilizes an interleaved, dependent arrangement. The banks extend across the memory (i.e., left and right in FIGS. 4 and 5) in generally elongate stripes such as the typical stripe designated within dashed line 60 in FIG. 5. However, within each elongate stripe 60 are two memory banks, subdivided into alternating array cores. For example, alternating array cores for banks 24 and 25 of the overall array are disposed within exemplary two-bank stripe 60 in FIG. 5.

The banks in memory 50 are also dependent, such that conditions must be imposed upon any two successive memory accesses. Those of ordinary skill in the art will recognize that when any two banks are dependent, they may not be accessed in direct succession. In the embodiment of FIG. 5, banks 0 and 1 are dependent, banks 2 and 3 are dependent, and so on through banks 30 and 31.

Figure 5A:
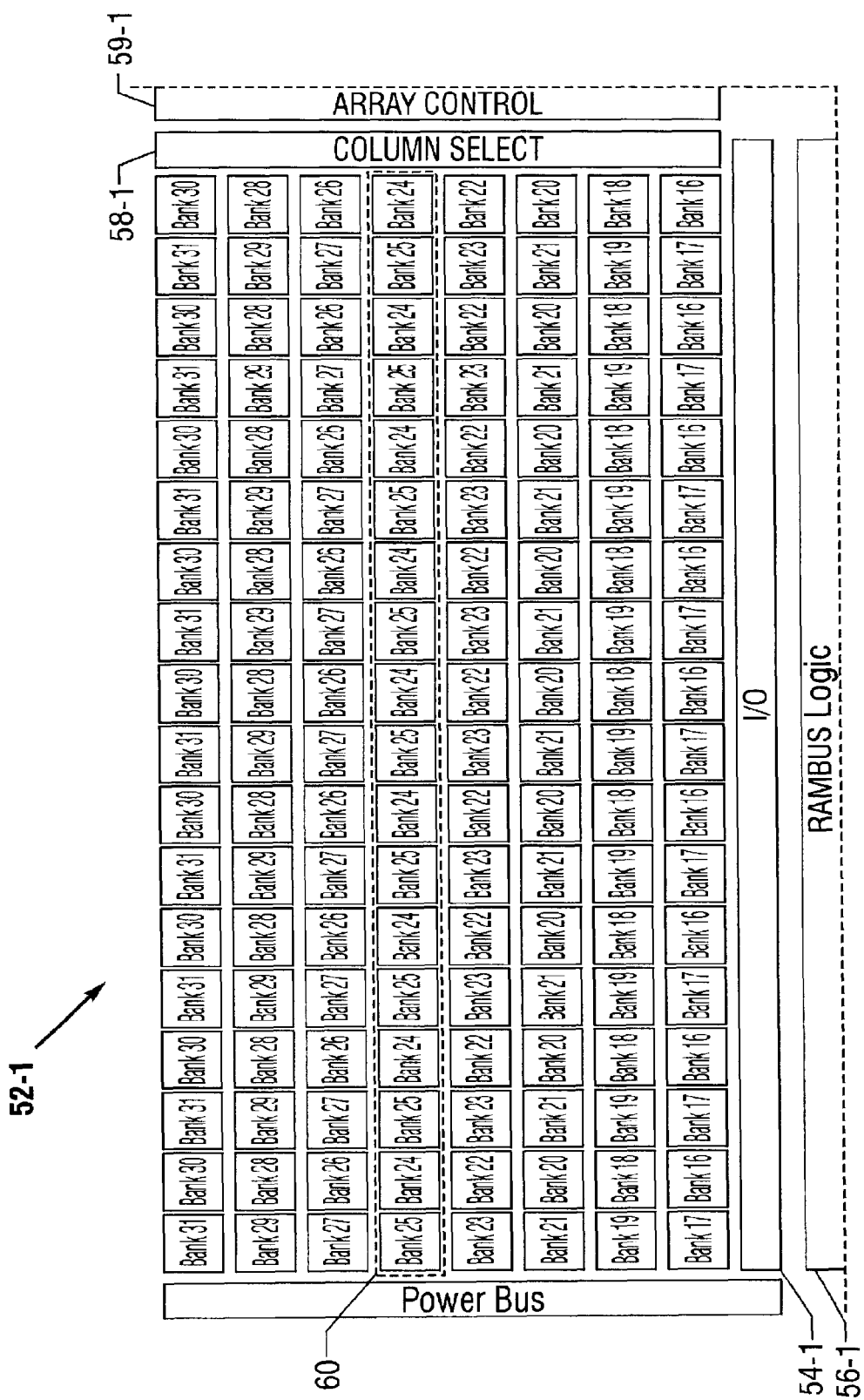
FIGS. 5A, 5B, 5C, and 5D are respective top left, top right, bottom left, and bottom right portions of a block diagram of the memory device from FIG. 4 showing the banked organization thereof.
Figure 5B:
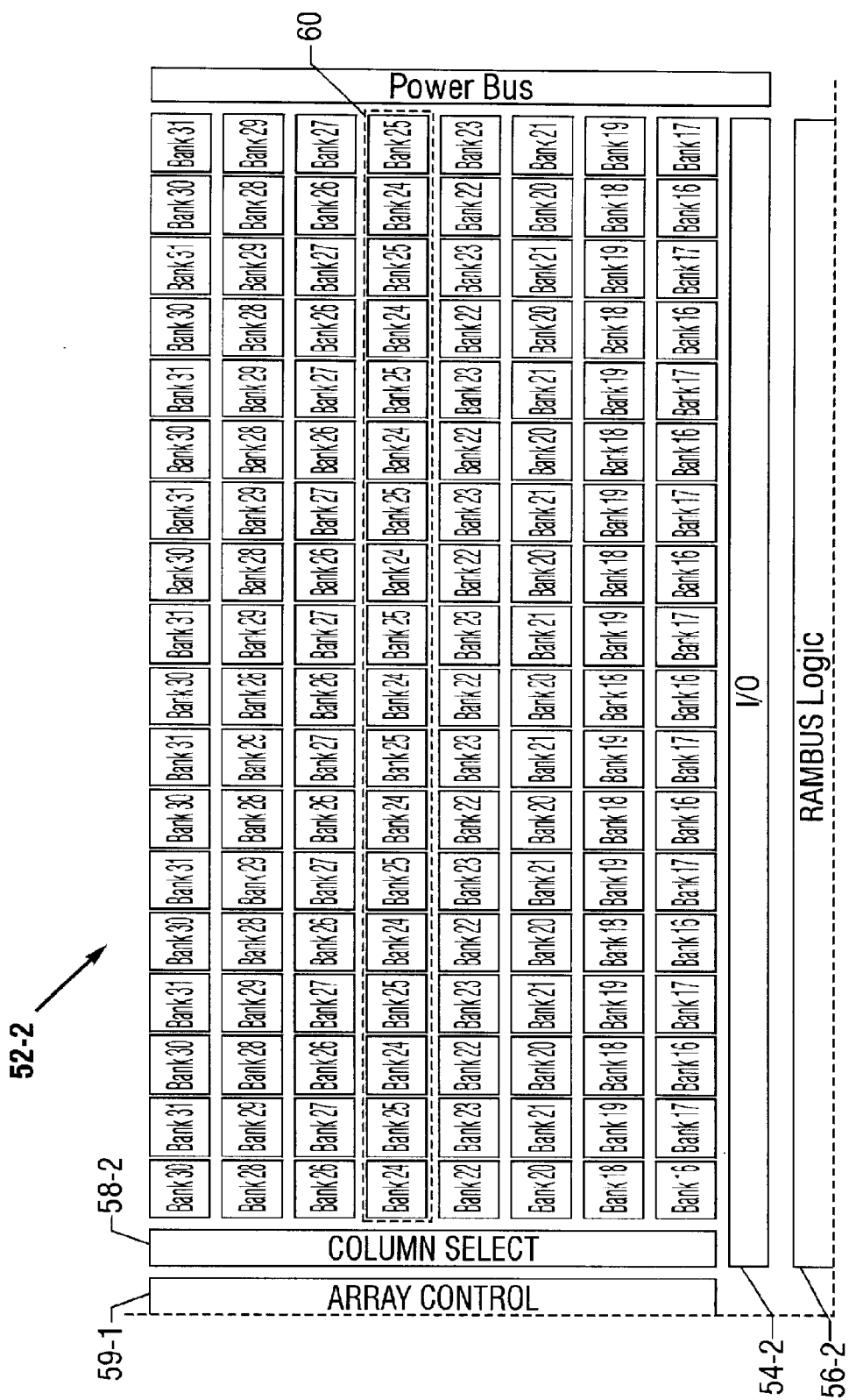
Figure 5C:
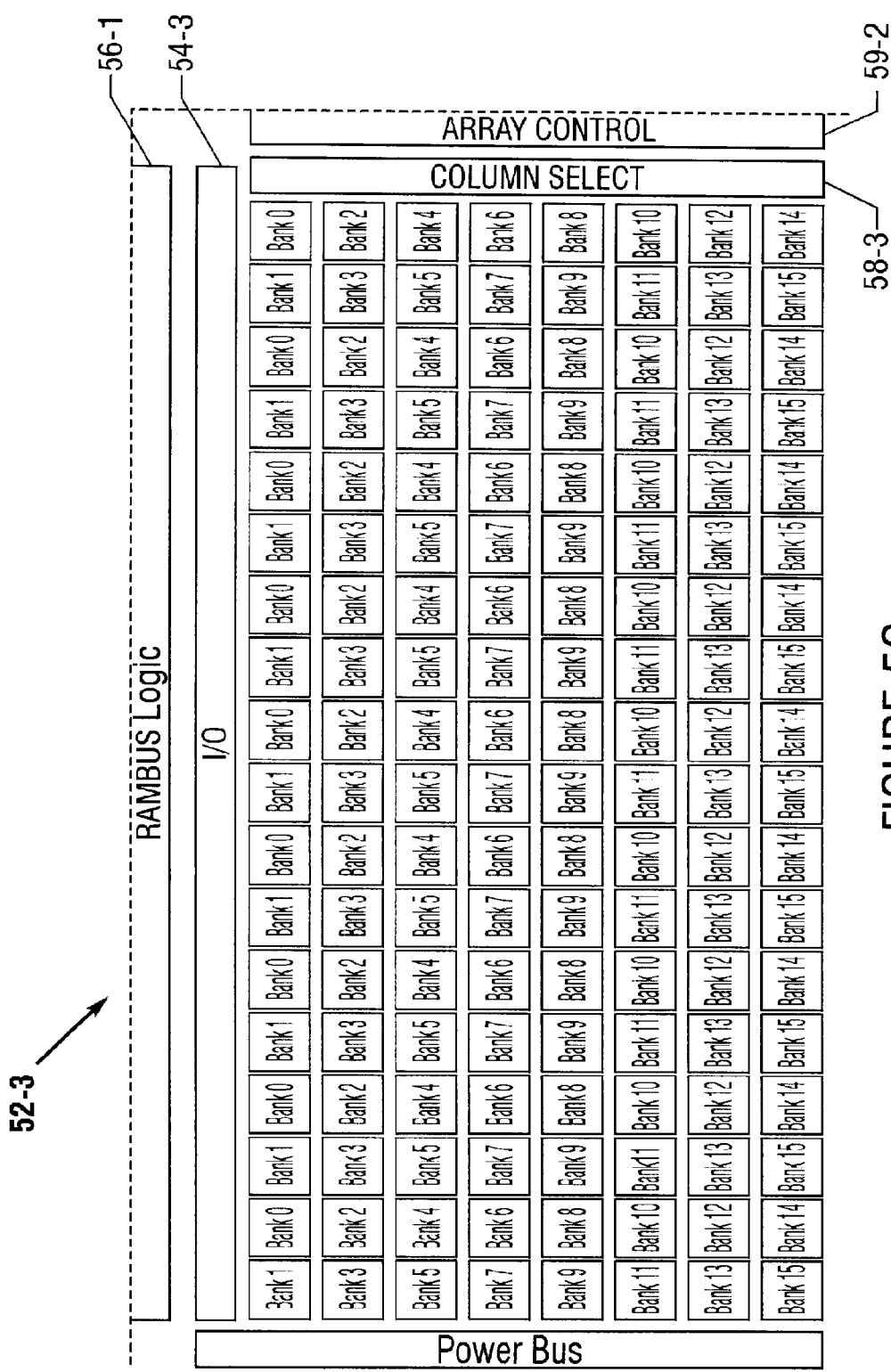

Continuing with the exemplary stripe 60 in FIG. 5A, containing banks 24 and 25, if a memory access is made to locations in bank 24, the memory controller must refrain from setting up the control signals for a subsequent access to dependent bank 25 before the access to bank is fully completed. While such an interleaved arrangement leads to restrictions in memory access, it is known to conserve die area, since sense amplifiers can be shared between cells in two different banks, and hence fewer sense amplifiers are required.

Figure 6:
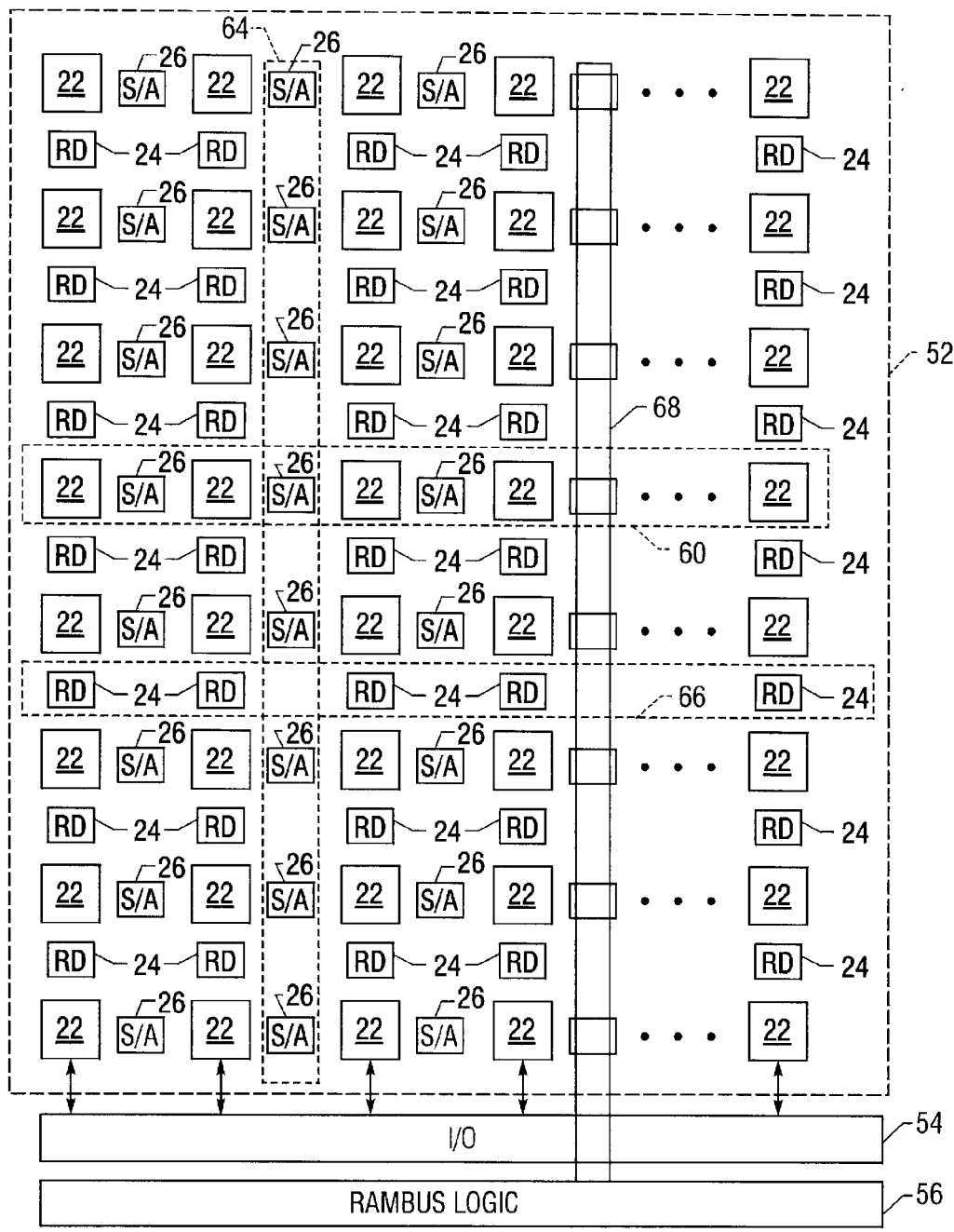
FIG. 6 is a block diagram of one of the sub-arrays in the memory device of FIG. 4.

FIG. 6 shows in greater detail the architecture of one of the four sub-arrays 52 in memory device 50. Each sub-array 52 comprises a plurality of memory cores 22 having sense amplifier circuitry 26 and row decoder circuitry 24 interleaved therewith.

In particular, disposed in an elongate "stripe" area is a row of associated sense amplifiers 26 shared by the adjacent memory cores 22, and each of the sense amplifiers 26 is disposed within one such elongate stripe area. One typical sense amplifier stripe is designated by dashed line 64 in FIG. 6, it being understood that a sense amplifier stripe is present between every two adjacent pairs of banks 20. Each sense amplifier stripe 64 extends in a direction substantially perpendicular to two-bank stripes 60. As a result, each sense amplifier stripe 64 passes over every bank in the sub-array 52.

On the other hand, row decoders 24 are disposed within elongate "stripe" areas that are substantially parallel to the two-bank stripes 60, a typical row decoder stripe being designated by dashed line 66 in FIG. 6. (Again, for clarity, only one exemplary two-bank stripe 60 is shown in FIG. 6.)

In memory device 50, power straps for providing necessary operating power to memory banks 20 extend generally in the region of sense amplifier stripes 64, i.e., perpendicular to the elongate direction of two-bank stripes 60. An exemplary power strap 68 is shown in FIG. 6, it being understood that a power strap 68 is disposed above each stripe sense amplifier stripe 64, although only one is shown for clarity. Again, those of ordinary skill in the art will appreciate that such power straps 68 are typically formed as one of a semiconductor device's metal layers, and are formed above sense amplifiers 26, with insulating layers of, for example, silicon oxide, separating the power straps from the structures comprising the sense amplifiers 26 and associated circuitry disposed in sense amplifier stripes 64.

Figure 5D:
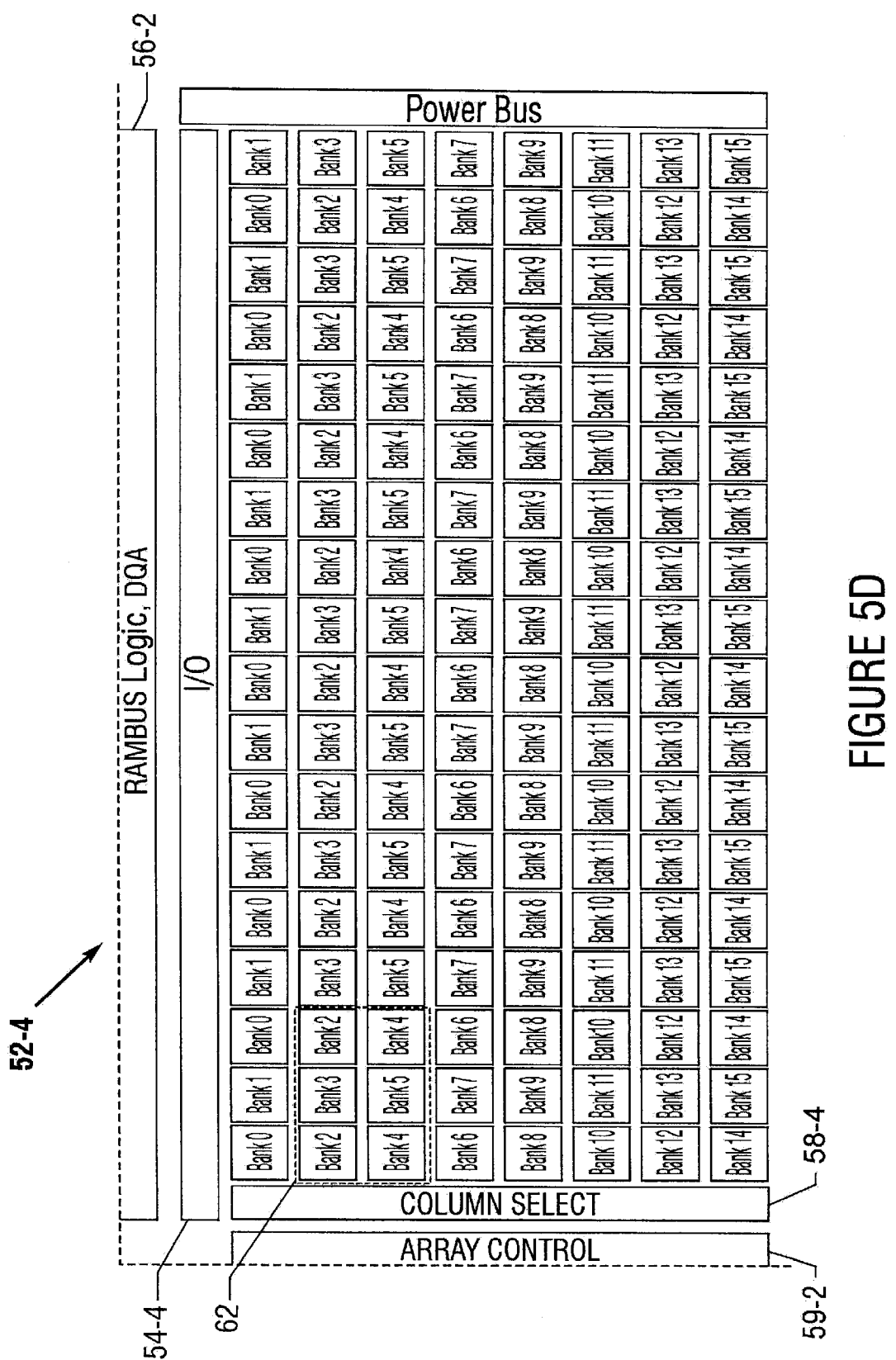
Figure 7:
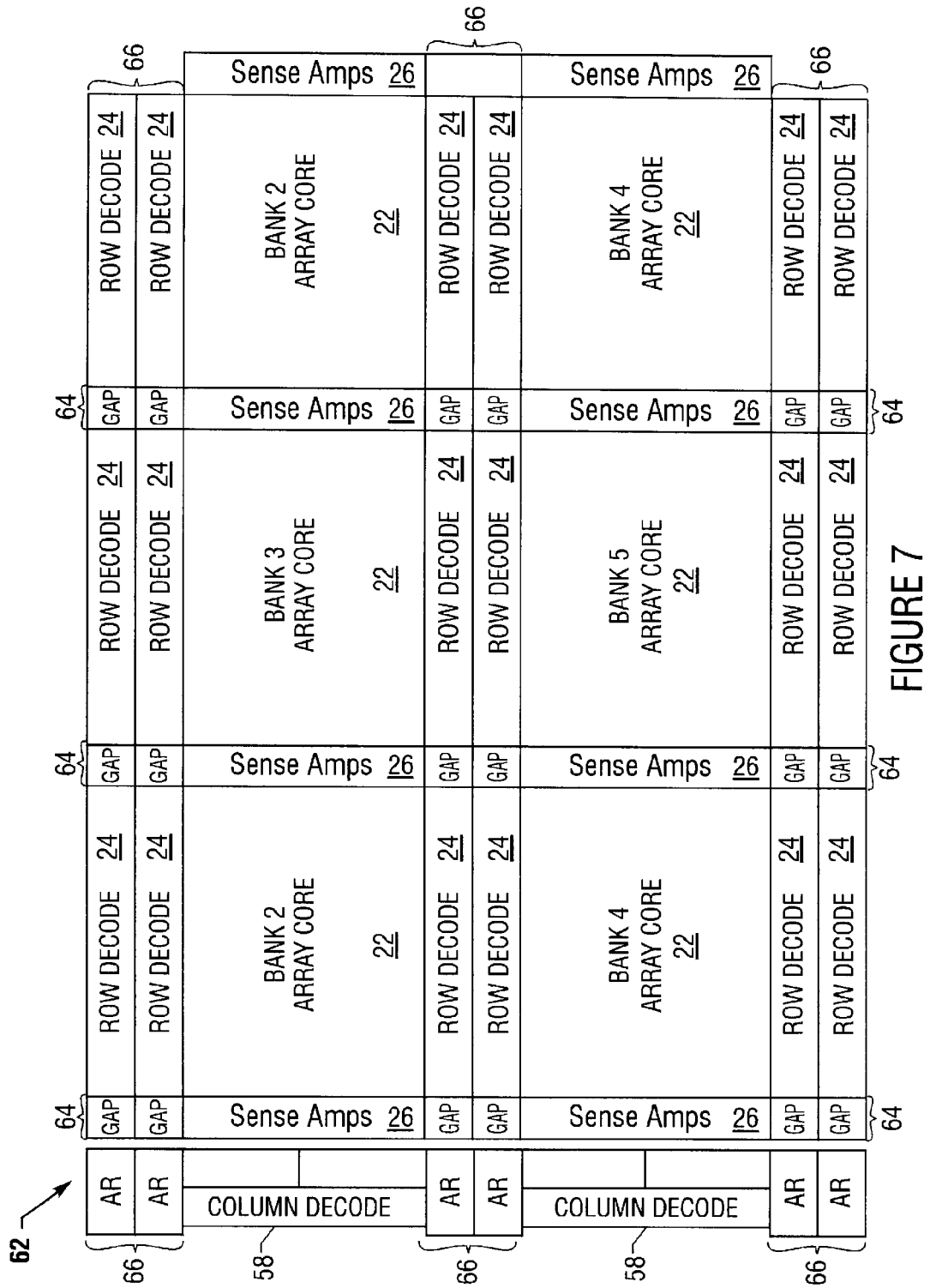
FIG. 7 is a block diagram of a portion of the sub-array from FIG. 6 showing a plurality of memory array cores therein.

The interleaved bank arrangement of memory device 50 can be better appreciated with reference to FIG. 7, which shows the portion of the memory array of memory device 50 designated with dashed line 62 in FIG. 5D.

As discussed above, a potential disadvantage to the architecture of the memory device from FIGS. 1–3 was that the column select lines each ran perpendicularly across each memory bank in a sub-array 14 such that at least some of the signals and noise generated by activating a column select line and associated circuitry for one bank can potentially interfere with operation of all other banks 20 in the sub-array. The embodiment of FIGS. 4–7 reduces, but does not eliminate, this potential problem, since due to the placement of the column decode circuitry and the interleaved bank arrangement, any given column select line can adversely affect only four banks in a sub-array.

Moreover, several of the potential drawbacks of the architecture shown in FIGS. 1–3 may be manifested in the architecture shown in FIGS. 4–7. Referring to FIG. 4, an arrow 70 indicates the general orientation of power straps 68. From FIG. 5, it is apparent that such orientation means that each power strap 68 is shared among multiple (specifically) four banks. As noted above, sharing power among multiple banks can be undesirable due to the resulting noise; this can necessitate increasing the size of power straps 68, which is undesirable from the standpoint of die size.

Likewise, an arrow 72 in FIG. 4 indicates the general orientation of some, but not all, of the control signals, and the data I/O signals generated in memory 50. On the other hand, an arrow 74 in FIG. 4 shows the orientation of other control signals in memory 50 (such as, for example, the row control signals generated by row control circuits 59-1 and 59-2). Arrow 76 indicates the orientation of the column select signals generated by column select circuits 58-1, 58-2, 58-3, and 58-4.

From the foregoing, it is apparent to those of ordinary skill in the art that the problem of column select lines being shared among all banks in a sub-array (as in the memory of FIGS. 1–3) is minimized in the embodiment of FIGS. 5–7, in that each column select line is shared by at most four banks as a result of the interleaved banking arrangement observable in FIG. 5. Nonetheless, the potential timing problems with control signals being applied to a sub-array from different and essentially perpendicular directions, and the noise issues arising out of the sharing of power among multiple banks are still present in the embodiment of FIGS. 5–7.

Figure 8:
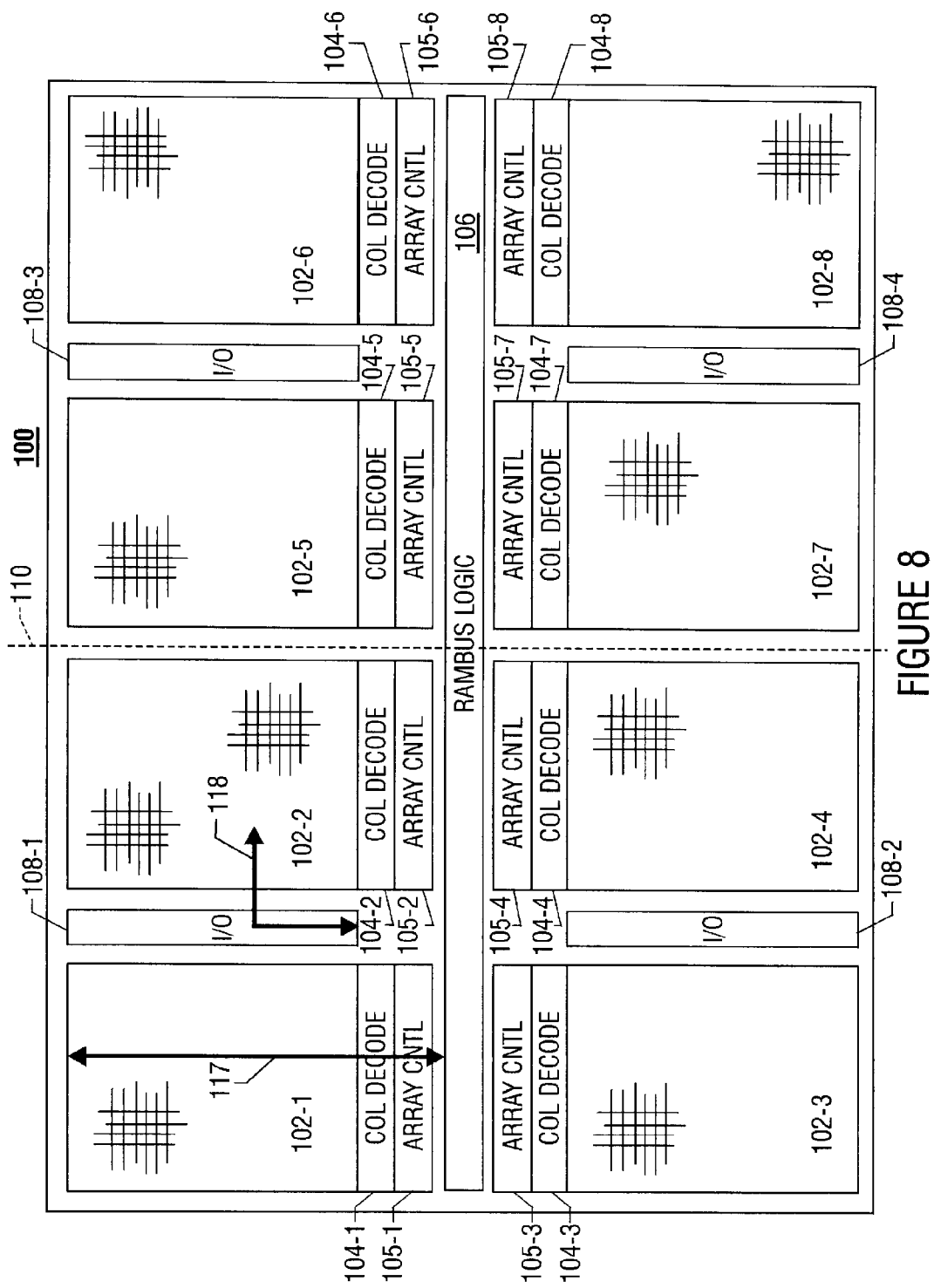
FIG. 8 is a block diagram of a semiconductor memory device in accordance with one embodiment of the invention.

Turning now to FIG. 8, there is shown a block diagram of a memory device 100 in accordance with one embodiment of the invention. As shown in FIG. 8, memory device 100 comprises eight memory sub-arrays 102-1 through 102-8 in a two-by-four arrangement. Each pair of sub-arrays (102-1 and 102-2; 102-3 and 102-4; 102-5 and 102-6; 102-7 and 102-8) shares an I/O circuit 108-1, 108-2, 108-3, and 108-4, respectively. Column decoding circuits 104-1 through 104-8 are associated with each sub-array 102-1 through 102-8, respectively. Column decode circuits 104 are disposed generally below sub-arrays 102 in the upper half of memory device 100 and generally above sub-arrays 102 in the lower half of memory device 100.

Similarly, array control circuits 105-1 through 105-8 are associated with each sub-array 102-1 through 102-8, respectively, with control circuits 105 being disposed generally below sub-arrays 102 in the upper half of device 100 and generally above sub-arrays 102 in the lower half of device 100.

I/O circuits 108 are disposed in an elongate strip alongside each sub-array 102. In accordance with one embodiment of the invention, each I/O circuit 108 is shared between and operationally coupled to two adjacent sub-arrays 102. In this way, only half as many I/O circuits 108 as sub-arrays 102 are needed. Rambus logic 106 is disposed in an elongate area extending from side to side between upper sub-arrays 102-1, 102-2, 102-5 and 102-6 (and associated column decode and array control circuits) and lower sub-arrays 102-3, 102-4, 102-7 and 102-8 (and associated column decode and array control circuits).

Figure 9:
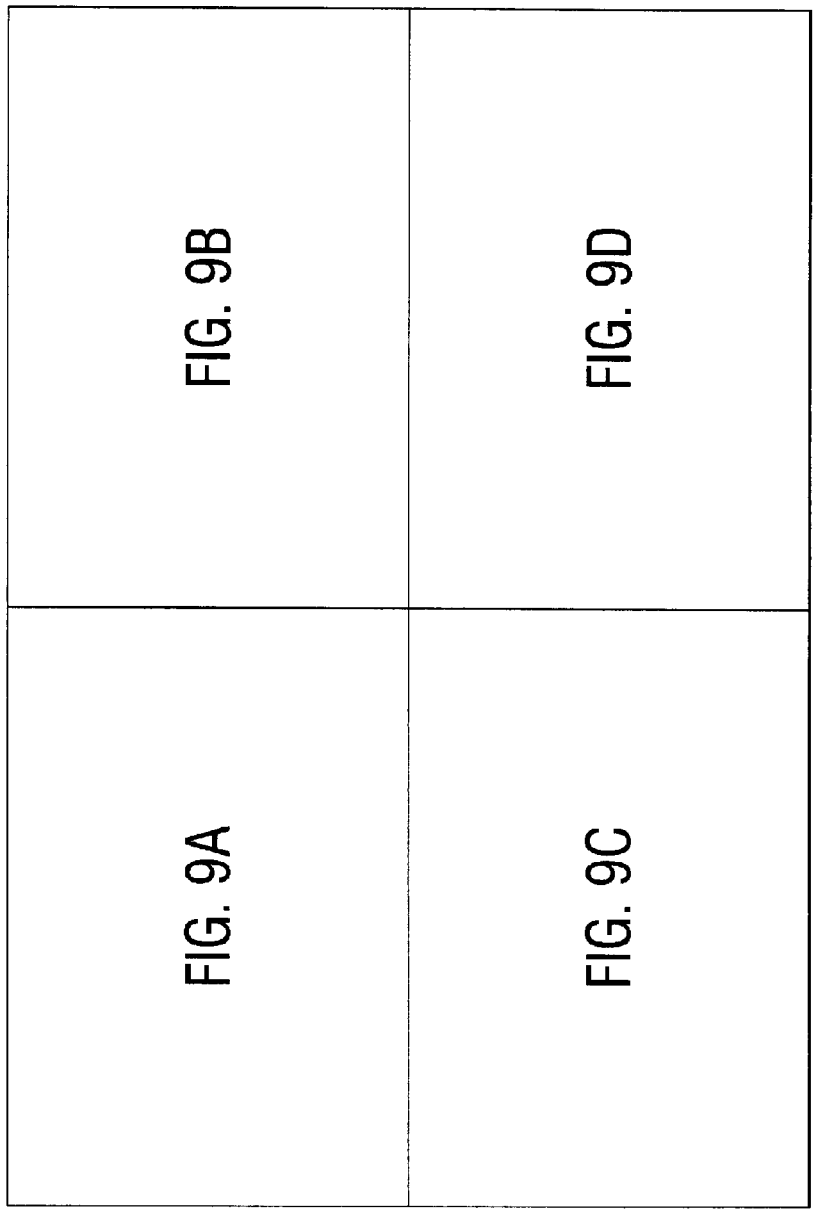
FIG. 9 shows the proper relationship between FIGS. 9A, 9B, 9C, and 9D.

The embodiment of FIG. 8 employs an interleaved, dependent bank arrangement similar to the embodiment of FIGS. 4–7. The organization of the banks can be observed in FIGS. 9A, 9B, 9C, and 9D, which when assembled as shown in FIG. 9 show one sub-array 102 of memory 100 in more detail. (FIGS. 9A, 9B, 9C, and 9D are collectively referred to hereafter as "FIG. 9;" also, it is to be understood that the sub-arrays 102-1 through 102-8 are essentially identical; reference numeral 102 is used when referring to the sub-arrays generally.) As discussed above, those of ordinary skill in the art will appreciate that organizing a memory array into interleaved banks, while necessitating certain restrictions on the memory locations accessible on successive cycles (i.e., creating dependencies), significantly reduces the number of sense amplifiers needed, and improves the efficiency of access cycles.

As can be seen in FIG. 9, memory sub-arrays 102 are organized into 32 separate but interleaved banks 0–31. From FIGS. 8 and 9, it is also apparent that memory 100 is divided into substantially identical left and right halves; that is, the portion of memory array 100 on the left side of dashed line 110 is substantially identical to the portion of memory array on the right side of dashed line 110. As a result, one half of each of the thirty-two banks is disposed on the left-hand side of the array, and the other half of each of the thirty-two banks is disposed on the right. This balance is believed to be advantageous from the standpoint of signal timing, among other considerations.

Figure 10:
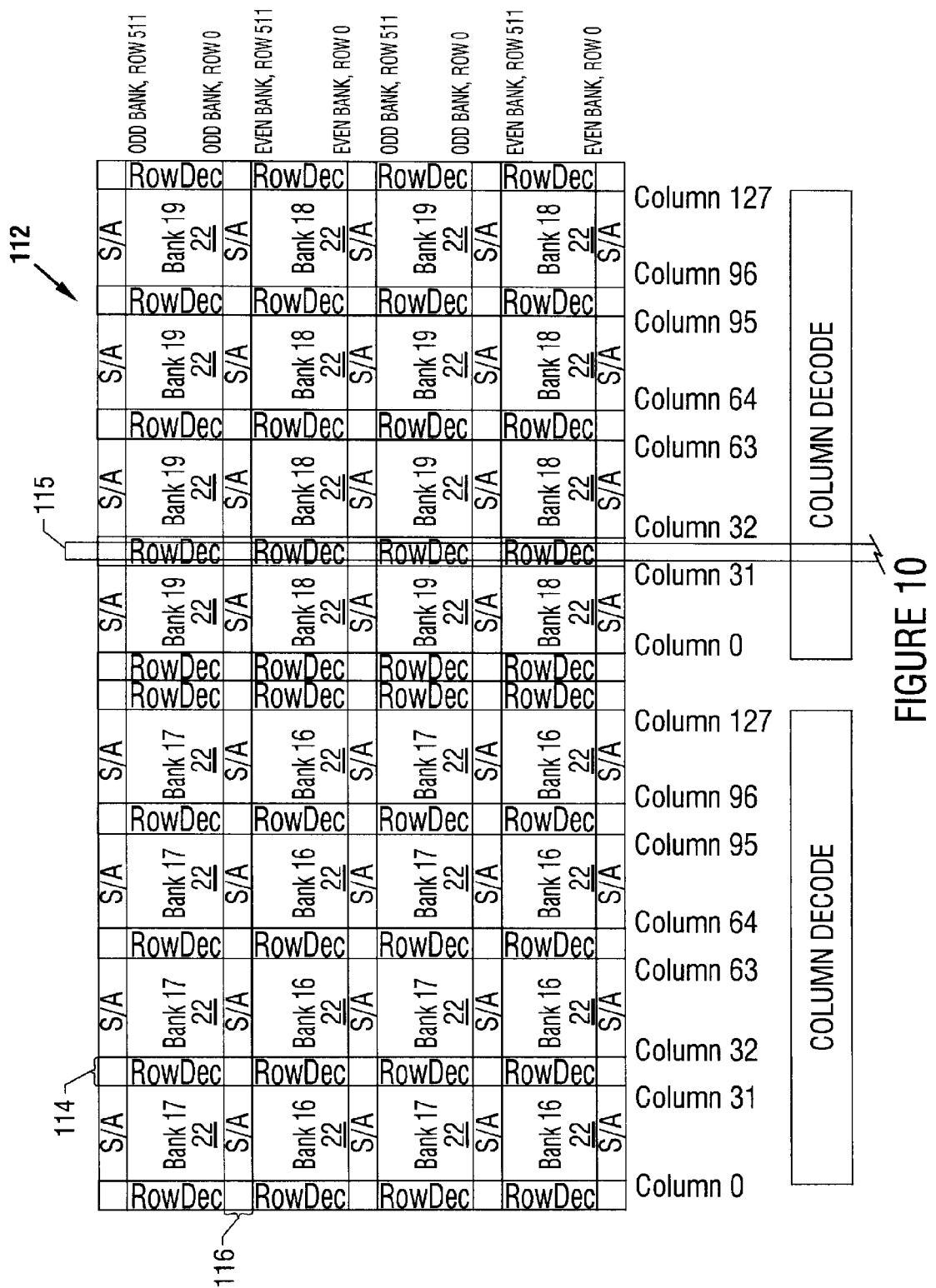
FIG. 10 is a block diagram of a portion of the memory array in the memory device of FIG. 8.

From FIG. 9, it is apparent that each bank 0–31 within a sub-array 102 is organized logically and physically into a plurality of memory cores 22. FIG. 10 shows the portion of sub-array 102-1 within dashed line 112, comprising 32 individual memory cores 22, in more detail. As can be seen in FIG. 10, each interleaved portion of the memory bank comprises four memory cores of 32 columns and 512 rows of memory cells. A vertical stripe of row decoders separates adjacent columns of memory cores 22, with an exemplary row decoder stripe being designated with reference numeral 114 in FIGS. 9 and 10. Similarly, a horizontal stripe of sense amplifiers separates adjacent rows of memory cores 22, with an exemplary sense amplifier stripe being designated with reference numeral 116 in FIG. 10. In the preferred embodiment, elongate power straps are disposed over row decode stripes 114. An exemplary power strap is designated with reference numeral 115 in FIG. 10.

The architecture of memory 100 of FIGS. 8–10 is believed to offer certain advantages over prior art architectures, particularly with respect to the routing of the various control, data, and power signals asserted during operation of the device. With reference to FIG. 8, an arrow designated with reference numeral 117 indicates the general orientation of power signals conducted on the power straps, the column select signals, and the control signals generated by array control circuitry 105. Because of the bank arrangement, this means that power is not shared by all banks in a sub-array, but instead is shared only by two interleaved banks. This eliminates or at least substantially reduces the undesirable noise and interference effects which can occur with prior art architectures such as that described above.

Figure 9A:
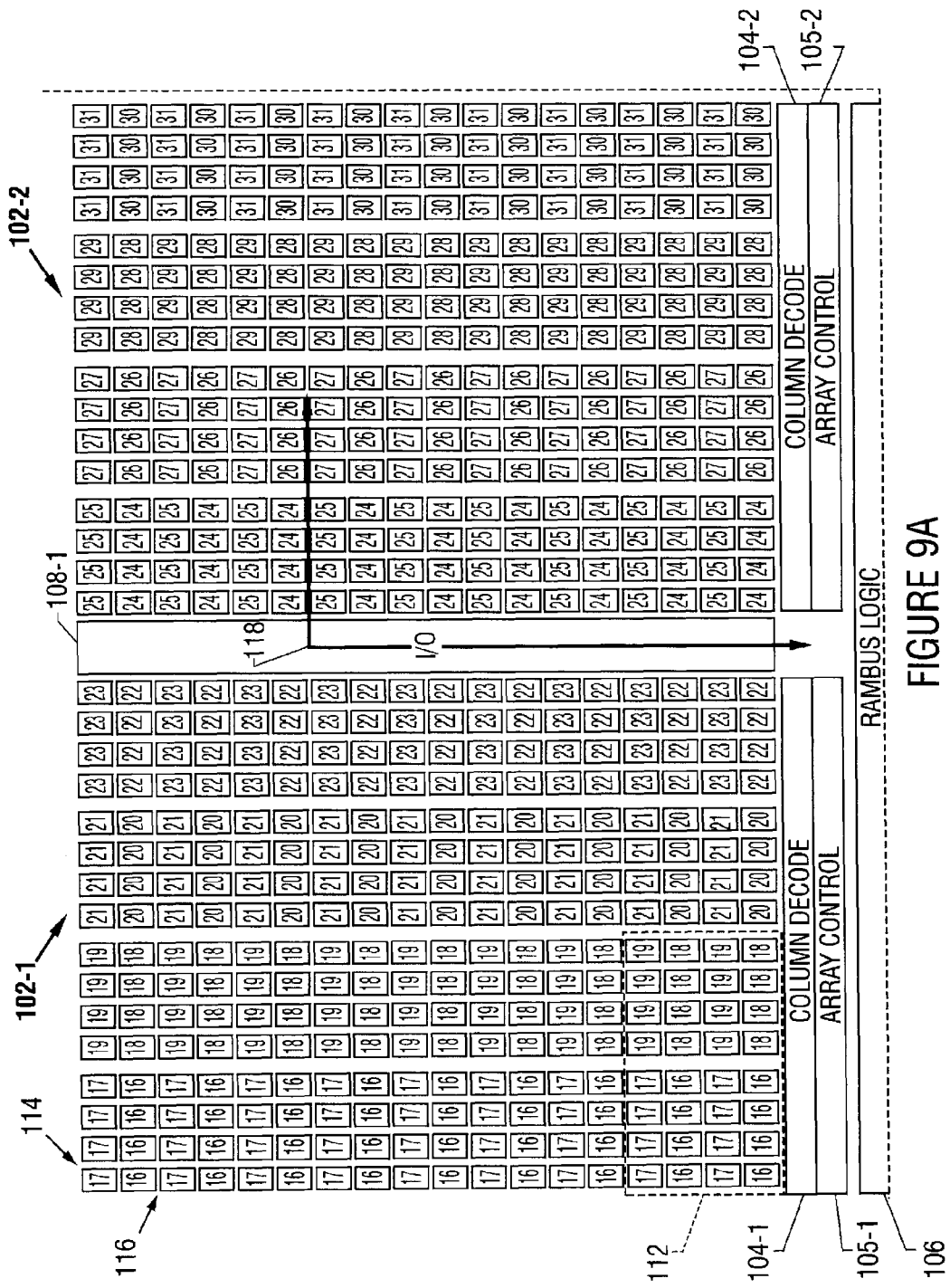
Figure 9B:
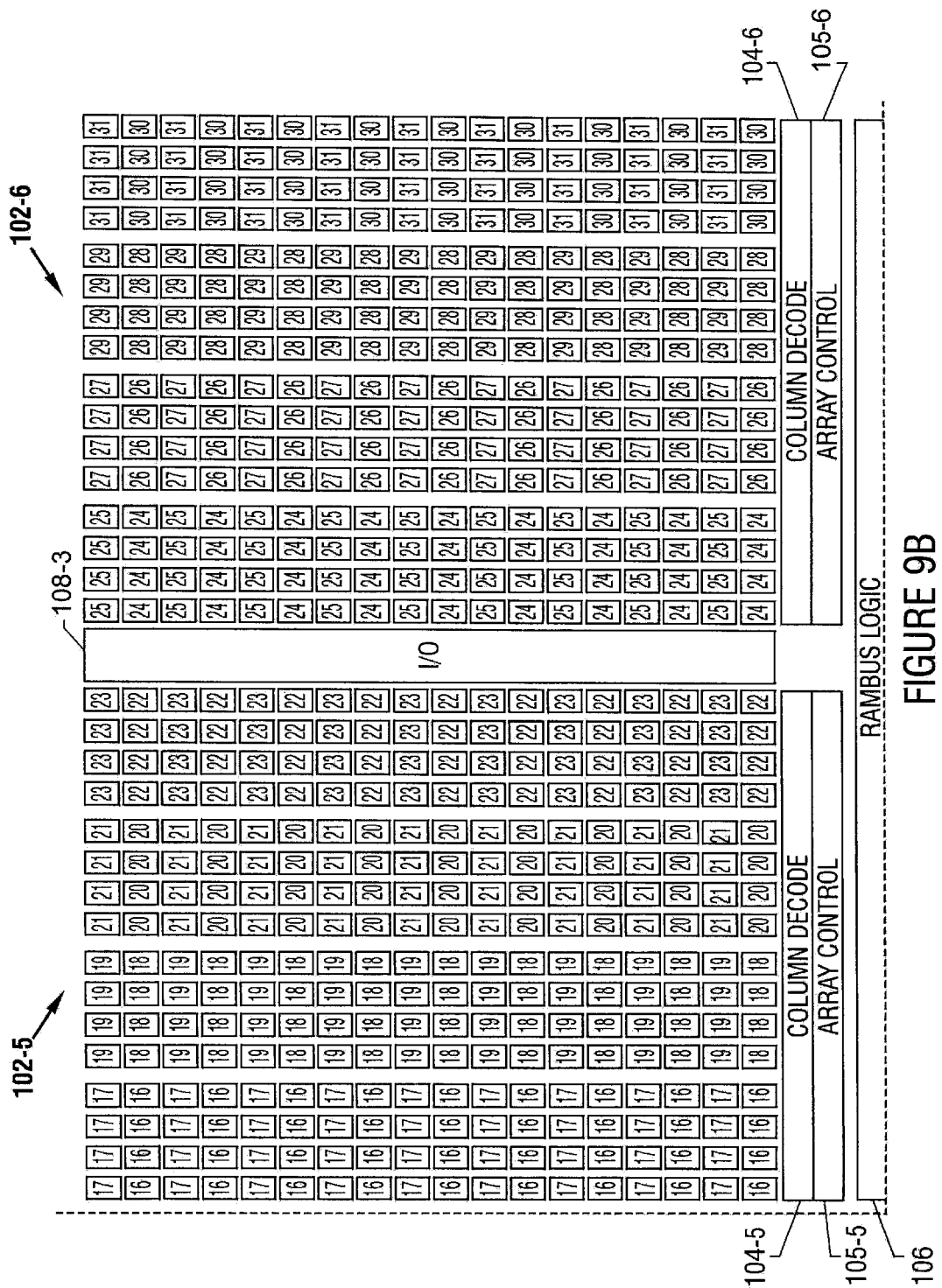
Figure 9D:
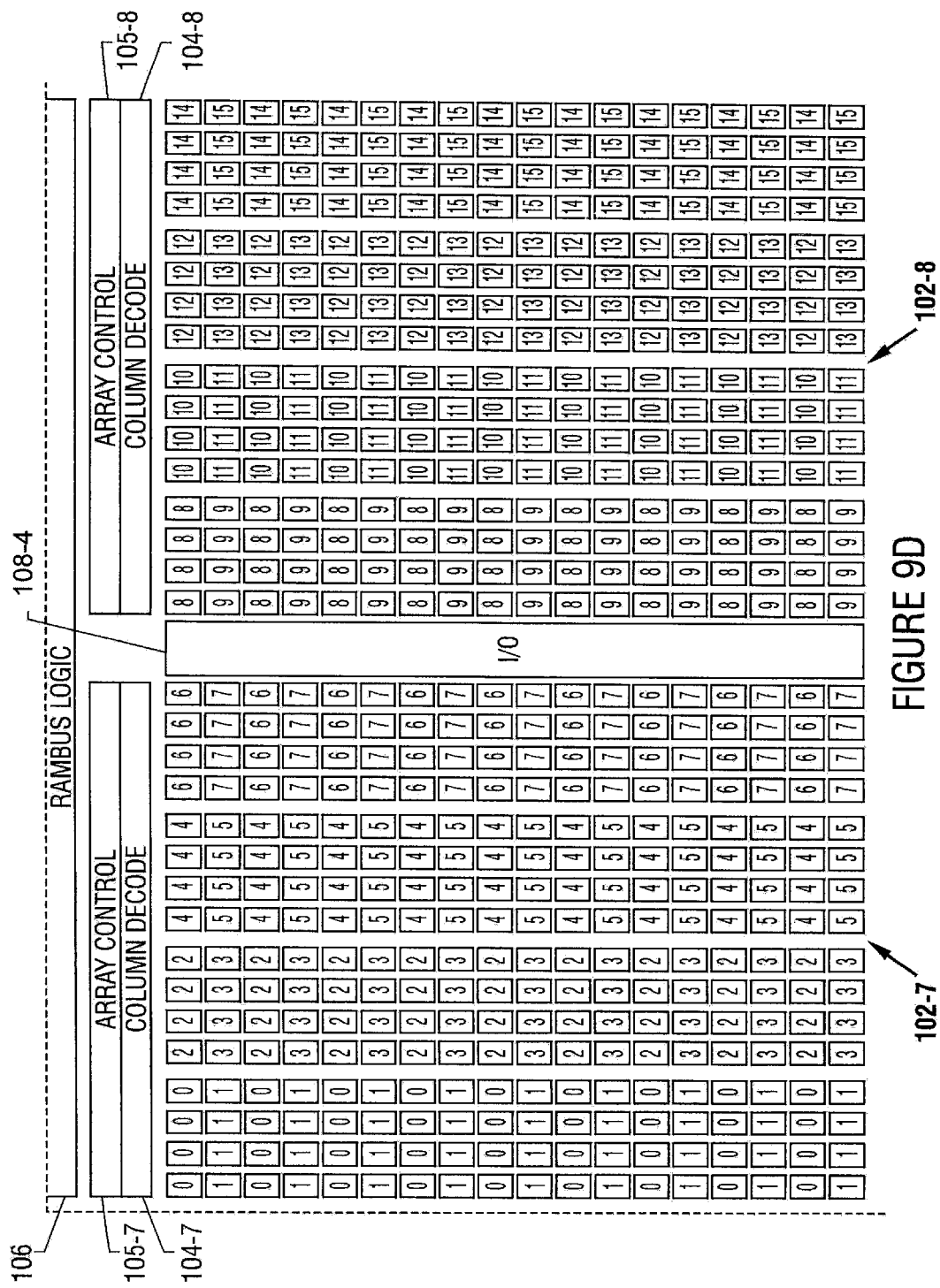

In accordance with one aspect of the invention, the layout and orientation of sense amplifier stripes 116 is adapted to minimize the opportunity for noise and cross-coupling with power and column select signals in each sub-array. Referring to FIGS. 8 and 9A, an arrow 118 indicates the routing of I/O signals to and from an arbitrary memory cell in sub-array 102-2. As can be seen from FIG. 8, during a read cycle the I/O signals from a given cell are propagated along the sense amplifier stripe 116 corresponding to that cell to the shared I/O circuit 108-1, and thereafter propagated along the I/O circuitry. Because of this routing, the opportunity for interference from column select signals, control signals, and power signals is advantageously minimized.

Several features of the architecture of memory device 100 as described herein are to be noted. First, because of the banked, interleaved organization of the memory cells and the orientation of the power straps, power on any given power strap is shared between only a limited number of banks, thereby minimizing noise and interference in the power supplied to the operational circuitry. Second, power, control, and column select signals are all propagated along substantially parallel paths, oriented as represented by arrow 117 in FIG. 8. Third, all control signals are propagated in the same direction (again, as represented by arrow 117), thereby eliminating the potential problems with precise control signal timing which can arise when some control signals are propagated in one direction and others are propagated in another. Fourth, the arrangement of I/O circuits 108 minimizes the opportunity for noise and interference between I/O signals and power, column select, and control signals in a given sub-array 102.

From the foregoing detailed description of a specific embodiment of the invention, it should be apparent that an improved architecture for a semiconductor memory device has been disclosed. The architecture advantageously minimizes or avoids signal interference and cross coupling by ensuring that control signals, power signals, and column select signals propagate in substantially parallel directions throughout the memory array. The architecture further avoids having power straps coupled to large numbers of memory banks. Accordingly, the power strap size can be minimized, thereby minimizing overall device size while maximizing logical efficiency.

Although a detailed description of a specific embodiment has been provided herein, this has been done solely for the purposes of illustrating various features and aspect of the invention and is not intended to be limiting with respect to the scope of the invention as defined in the claims. It is contemplated that numerous variations, alterations, and/or modifications, including but not limited to those which may be specifically noted herein, may be made to the disclosed embodiment without departing from the spirit and scope of the invention as defined in the appended claims, which follow.

What is claimed is:

1. A semiconductor memory device, comprising:

an array of memory cells arranged in rows and columns, said rows extending in a first direction and said columns extending in a second direction substantially perpendicular to said first direction;

wherein said array of memory cells is organized into a plurality of memory cell cores each comprising a plurality of said memory cells, said memory cell cores being arranged in an array of rows and columns of memory cell cores extending in said first and second directions, respectively;

and wherein each two adjacent columns of memory cores define a substantially columnar stripe therebetween, such that a plurality of said columnar stripes are defined throughout said plurality of memory cell cores;

said memory device further comprising:

a plurality of conductive column select lines extending in said second direction along said columnar stripes defined between adjacent columns of memory cell cores;

a plurality of conductive power straps extending in said second direction along said columnar stripes defined between adjacent columns of memory cell cores; and a plurality of conductive control signal lines extending in said second direction along said columnar stripes defined between adjacent columns of memory cell cores;

wherein each two adjacent rows of memory cell cores define an elongate stripe therebetween extending in said first direction;

wherein said memory device further comprises sense amplifier circuitry disposed in said elongate stripes extending in said first direction between adjacent rows of memory cell cores;

wherein said memory device is organized into a plurality of sub-arrays of memory cells arranged in rows and columns of sub-arrays extending in said first and second directions, respectively, each sub-array comprising a plurality of memory cell cores;

said memory device further comprising at least one input/output (I/O) circuit disposed between and functionally coupled to two sub-arrays in a row of said sub-arrays.

2. A semiconductor memory device in accordance with claim 1, further comprising:

column decode circuitry disposed in an elongate region extending in said first direction between adjacent sub-arrays of memory cells.

3. A semiconductor memory device in accordance with claim 1, comprising half as many I/O circuits as sub-arrays, each I/O circuit being disposed between and functionally coupled to two of said sub-arrays.

4. A semiconductor memory device in accordance with claim 1, further comprising, for each of said sub-arrays:

column decode circuitry, coupled to said column select lines, responsive to column address signals to apply a column select signal to one of said column select lines.

5. A semiconductor memory device in accordance with claim 4, wherein for each of said sub-arrays, said column decode circuitry is proximal to an edge of each said sub-array and extends substantially in said first direction.

6. A semiconductor memory device in accordance with claim 5, further comprising, for each of said sub-arrays:

array control circuitry, coupled to said control signal lines and adapted to apply control signals thereto, such that said control signals and said column select signals are propagated along substantially parallel paths in said second direction.

7. A semiconductor memory device in accordance with claim 6, further comprising a plurality of elongate power straps extending in said second direction over said sub-arrays, said power straps conducting operational power in a direction substantially parallel to said control signals and column select signals.

8. A semiconductor memory device in accordance with claim 1, wherein said device is a dynamic random access memory (DRAM).

9. A semiconductor memory device in accordance with claim 8, wherein said device is a Rambus DRAM.

10. A semiconductor memory device in accordance with claim 9, wherein Rambus logic for controlling operation of the device in accordance with a Rambus standard is disposed in an elongate region extending in said first direction between an upper row of sub-arrays and a lower row of sub-arrays.

11. A semiconductor memory device in accordance with claim 1, wherein said array of rows and columns of memory cells is logically and physically organized into a plurality of sub-arrays, each sub-array comprising a plurality of said memory cell cores;

and wherein each of said sub-arrays is logically and physically organized into a plurality of memory banks.

12. A semiconductor memory device in accordance with claim 11, wherein said plurality of memory banks are interleaved.

13. A semiconductor memory device in accordance with claim 12, wherein, for each sub-array, each power strap is coupled to fewer than all memory banks present in said sub-array.

14. A semiconductor memory device in accordance with claim 13, wherein, for each sub-array, each power strap is coupled to half of said memory banks present in said sub-array.

15. A semiconductor memory device in accordance with claim 14, wherein each sub-array has four memory banks present therein.

16. A semiconductor memory device in accordance with claim 12, wherein for each sub-array, each column select line is coupled to fewer than all memory banks present in said sub-array.

17. A semiconductor memory device in accordance with claim 16, wherein for each sub-array, each column select line is coupled to half of said memory banks present in said sub-array.

18. A semiconductor memory device in accordance with claim 17, wherein each sub-array has four memory banks present therein.

19. A semiconductor memory device, comprising:

an array of rows and columns of memory cells organized into a plurality of sub-arrays, said rows of memory cells extending in a first direction and said columns extending in a second direction perpendicular to said first direction;

a plurality of power straps disposed over each sub-array for providing power to operational circuitry within each said sub-array;

wherein each sub-array has an associated plurality of elongate column select lines therein;

wherein each sub-array has a column decode circuit coupled to said associated column select lines, said column decode circuit is responsive to a column address to assert a column select signal on at least one column select line in said sub-array;

wherein said column select lines and said power straps are oriented in the same one of said first and second directions;

and wherein each sub-array has a plurality of elongate control signal lines therein, said memory device further comprising:

an array control circuit associated with each sub-array, said array control circuit coupled to said elongate control signal lines in said associated sub-array and adapted to selectively apply control signals to said control signal lines during operational cycles of said device;

wherein said elongate control signal lines are oriented in the same one of said first and second directions as said power straps and column select lines.

20. A semiconductor memory device in accordance with claim 19, wherein each sub-array is physically and logically subdivided into a plurality of memory cell cores arranged in rows and columns extending in said first and second directions, respectively;

wherein adjacent rows of said memory cell cores define a plurality of elongate stripes therebetween extending in said first direction;

and wherein adjacent columns of said memory cell cores define a plurality of elongate stripes therebetween extending in said second direction.

21. A semiconductor memory device in accordance with claim 20, wherein each sub-array further comprises row decode circuitry disposed in said elongate stripes extending in said second direction.

22. A semiconductor memory device in accordance with claim 21, wherein each sub-array further comprises sense amplifier circuitry disposed in said elongate stripes extending in said first direction.

23. A semiconductor memory device in accordance with claim 22, further comprising:

an input/output (I/O) circuit coupled to two sub-arrays for receiving I/O signals generated by said sense amplifier circuitry in said at least two sub-arrays;

wherein said I/O circuit extends along one edge of each of said two sub-arrays, said one edge extending in said second direction.

24. A semiconductor memory device in accordance with claim 23, wherein for each sub-array, said column decode circuit is disposed proximate a second edge of each said sub-array, said second edge extending in said first direction.

25. A semiconductor memory device, comprising:

an array of memory cells arranged in rows and columns, said rows extending in a first direction and said columns extending in a second direction substantially perpendicular to said first direction;

wherein said array of memory cells is organized into a plurality of memory cell cores each comprising a plurality of said memory cells, said memory cell cores being arranged in an array of rows and columns of memory cell cores extending in said first and second directions, respectively;

and wherein each two adjacent columns of memory cell cores define a substantially columnar stripe therebetween, such that a plurality of said columnar stripes are defined throughout said plurality of memory cells;

said memory device further comprising:
 a plurality of elongate conductive column select lines for selecting at least one column of memory cells in response to a column address
 a plurality of elongate conductive power straps for providing power to said memory cell cores;
 a plurality of elongate conductive control signal lines for conveying control signals to said memory cell cores;

wherein said plurality of elongate conductive power straps and said plurality of elongate conductive control signal lines extend in said second direction along said columnar stripes defined between adjacent columns of memory cell cores;

wherein said memory device is organized into a plurality of sub-arrays of memory cells arranged in rows and columns of sub-arrays extending in said first and second directions, respectively, each sub-array comprising a plurality of memory cell cores;

said memory device further comprising at least one input/output (I/O) circuit disposed between two sub-arrays in a row of sub-arrays.

26. A semiconductor memory device in accordance with claim 25, wherein said memory device further comprises sense amplifier circuitry disposed in elongate stripes extending in said first direction between adjacent rows of memory cell cores.

27. A semiconductor memory device in accordance with claim 26, wherein each two adjacent rows of memory cell cores define an elongate stripe therebetween extending in said first direction, and wherein said plurality of elongate column select lines extending in said columnar stripes extending in said second direction between adjacent columns of memory cell cores.

28. A semiconductor memory device in accordance with claim 25 further comprising, for each of said sub-arrays:

column decode circuitry, coupled to said column select lines, responsive to column address signals to apply a column select signals to at least one of said column select lines.

29. A semiconductor memory device in accordance with claim 28, wherein for each of said sub-arrays, said column decode circuitry is proximal to an edge of each said sub-array and extends substantially in said first direction.

30. A semiconductor memory device in accordance with claim 25, wherein said device is a dynamic random access memory (DRAM).

31. A semiconductor memory device in accordance with claim 30, wherein said device is a Rambus DRAM.

32. A semiconductor memory device in accordance with claim 31, wherein Rambus logic for controlling operation of the device in accordance with a Rambus standard is disposed in an elongate region extending in said first direction between an upper row of sub-arrays and a lower row of sub-arrays.

33. A semiconductor memory device in accordance with claim 25, wherein said array of rows and columns of memory cells is logically and physically organized into a plurality of sub-arrays, each sub-array comprising a plurality of said memory cell cores;

and wherein each of said sub-arrays is logically and physically organized into a plurality of memory banks.

34. A semiconductor memory device in accordance with claim 33, wherein said plurality of memory banks are interleaved.

35. A semiconductor memory device in accordance with claim 33, wherein, for each sub-array, each power strap is coupled to fewer than all memory banks present in said sub-array.

36. A semiconductor memory device in accordance with claim 35, wherein, for each sub-array, each power strap is coupled to half of said memory banks present in said sub-array.

37. A semiconductor memory device in accordance with claim 36, wherein each sub-array has four memory banks present therein.

38. A semiconductor memory device in accordance with claim 37, wherein for each sub-array, each column select line is coupled to fewer than all memory banks present in said sub-array.

39. A semiconductor memory device in accordance with claim 38, wherein for each sub-array, each column select line is coupled to half of said memory banks present in said sub-array.

40. A semiconductor memory device in accordance with claim 39, wherein each sub-array has four memory banks present therein.

* * * * *